United States Patent
Lehmann et al.

(10) Patent No.: US 7,087,975 B2
(45) Date of Patent: Aug. 8, 2006

(54) AREA EFFICIENT STACKING OF ANTIFUSES IN SEMICONDUCTOR DEVICE

(75) Inventors: Gunther Lehmann, Poughkeepsie, NY (US); Axel Christoph Brintzinger, Livermore, CA (US); Gabriel Daniel, Jamaica Estates, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/751,474

(22) Filed: Dec. 28, 2000

(65) Prior Publication Data

US 2004/0217441 A1    Nov. 4, 2004

(51) Int. Cl.
*H01L 29/00* (2006.01)
(52) U.S. Cl. ...................... 257/530; 257/529
(58) Field of Classification Search ............... 257/529, 257/530, 202
See application file for complete search history.

(56) References Cited

U.S. PATENT DOCUMENTS

| | | |
|---|---|---|
| 4,635,345 A | 1/1987 | Hankins et al. |
| 5,191,241 A | 3/1993 | McCollum et al. |
| 5,313,424 A | 5/1994 | Adams et al. |
| 5,427,979 A | 6/1995 | Chang |
| 5,436,496 A | 7/1995 | Jerome et al. |
| 5,565,703 A * | 10/1996 | Chang ................... 257/530 |
| 5,747,869 A | 5/1998 | Prall et al. |
| 6,002,261 A | 12/1999 | Goldman |
| 6,018,475 A | 1/2000 | Papadas et al. |
| 2001/0055838 A1 | 12/2001 | Walker et al. |
| 2002/0088998 A1 | 7/2002 | Knall et al. |

FOREIGN PATENT DOCUMENTS

WO    WO 01/84553 A2    11/2001

* cited by examiner

*Primary Examiner*—Steven Loke
(74) *Attorney, Agent, or Firm*—Slater & Matsil, L.L.P.

(57) ABSTRACT

A semiconductor device is provided which is formed of a wafer having on a surface thereof an area efficient arrangement of at least two antifuses in vertically stacked relation and sharing a common intermediate electrode therebetween. The arrangement includes at least one lower antifuse having a lower counter electrode and a lower fusible insulator portion defining a lower fuse element of an initial high electrical resistance state which interconnects the lower counter electrode with the common intermediate electrode, and at least one upper antifuse, which may be the same as or different from the lower antifuse, the upper antifuse having an upper counter electrode and an upper fusible insulator portion defining an upper fuse element of an initial high electrical resistance state which interconnects the upper counter electrode with the common intermediate electrode.

16 Claims, 7 Drawing Sheets

AREA EFFICIENT STACKING OF ANTIFUSES IN SEMICONDUCTOR DEVICE

FIELD OF THE INVENTION

This invention relates to an electrical antifuse construction on a semiconductor wafer permitting area efficient stacking of antifuses in semiconductor device fabrication, and more particularly, to an arrangement of at least two antifuses in vertically stacked relation and sharing a common intermediate electrode therebetween for achieving a tight pitch such as with regard to closely laterally adjacent redundant antifuses in semiconductor device fabrication. As used herein, a semiconductor "wafer" means any semiconductor body, microelectronic device, substrate, chip or the like, e.g., of silicon, used to provide an integrated circuit or other related circuitry structure, and in particular capable of forming metal lines in insulation layers thereof.

BACKGROUND OF THE INVENTION

In fabricating microelectronic semiconductor device components and the like on a semiconductor wafer (substrate or chip), e.g., of silicon, to form an integrated circuit (IC), etc., various metal layers and insulation layers are provided in a selective sequence on the wafer. To maximize device component integration in the available wafer area to fit more components in the same area, increased IC miniaturization is utilized. Reduced pitch dimensions are used for denser packing of components per very large scale integration (VLSI) technique, e.g., at sub-micron dimensions, i.e., below 1 micron or 1,000 nanometers (nm) or 10,000 angstroms (A).

An ordinary electrical fuse is an expendable overcurrent protective device having a circuit-opening fusible (meltable), electrically conductive, e.g., metal or metallic material, fuse segment (fuse link) heated and destroyed by passing an overcurrent through it, so as to change it from an electrically conductive or "on" state to an electrically non-conductive or "off" state. The overcurrent heats the fuse link beyond the normal level of radiation loss of the generated resistance heat that keeps its temperature below that at which it melts. The fuse link resistance is determined by the material of which it is made, its cross sectional area and its temperature.

On the other hand, an antifuse is an electrically programmable two-electrode device of small area on a semiconductor wafer, functioning as an electronic switch, and having a fuse element of fusible insulation, e.g., dielectric, material, such as silicon dioxide, silicon nitride, or the like, of selective thickness, interposed between the two electrically conductive, e.g., metal or metallic, electrodes, i.e., an electrode and counter electrode. Upon activation by applying a programming voltage across the electrode and counter electrode to break down (cause a short in) the fusible insulation material and electrically interconnect the two electrodes, the antifuse irreversibly (permanently) changes from a high resistance, electrically non-conductive, unblown or "off", state to a low resistance, electrically conductive, blown or "on", state.

Antifuses are used as programmable switches to configure the circuitry of a semiconductor device. They can potentially increase wafer yield by module repair of extant circuit components in the produced semiconductor device, and thus can reduce wafer cost.

Antifuses are of various types, depending on the desired parameters, e.g., specific characteristics, and include gate oxide transistor structure based antifuses (gate oxide antifuses), dual damascene, i.e., contact, structure based antifuses (contact antifuses), bipolar junction transistor structure based antifuses (bipolar junction antifuses), and the like.

However, it is usually unclear during semiconductor wafer manufacture as to which type of electrical antifuses will exhibit sufficient desired parameters to be included in a given product. Therefore, it is generally sought to provide different antifuse types on a wafer in order to reduce the risk of inapplicability of a single antifuse type. Unfortunately, use of a combination of different antifuse types on the wafer normally leads to a wafer size overhead, i.e., a loss of tight pitch efficiency and of minimal wafer area usage.

A gate oxide antifuse is akin to a gate oxide transistor, e.g., a metal oxide semiconductor transistor (MOS transistor), and includes a gate electrode connected to a fusible insulator (fuse element), e.g., a gate oxide fusible insulator, having a source region and a drain region correspondingly laterally adjacent thereto, i.e., bilaterally having one such region on each side thereof, the source and drain regions in turn being connected to the opposing electrode.

A dual damascene antifuse is a contact antifuse (formed of a pair of standard contacts, with a fusible insulator, i.e., fuse element, therebetween), e.g., an antifuse in a via between a lower metal layer and an upper metal layer, having a conductive contact interposed between one of the electrodes and the fusible insulator (fuse element), the fuse element in turn being connected to the opposing electrode as the other contact.

A bipolar junction antifuse is akin to a bipolar junction transistor (BJT) and includes an emitter region as one electrode connected to a fusible insulator (fuse element) which in turn is connected to the opposing electrode.

Redundancy techniques are used in semiconductor device fabrication to provide deliberate duplication of circuit components to decrease the probability of a circuit failure and thus increase circuit reliability, and also to permit specific or custom design features to be incorporated selectively in the circuitry. To offset defects that can occur in the circuitry, multiple copies of a given circuit component are connected in parallel to achieve continued operation upon failure of a particular component (module repair). Also, multiple copies of a given circuit component are included to provide selective modification of the chip circuitry (custom design).

Each such multiple component is provided with an antifuse that can be blown, i.e., activated, to replace a failed component by a duplicate one during antifusing operation of redundancy activation wiring, e.g., at final IC wafer testing, or to create a custom design type circuit. Alternatively, each such multiple component is provided with an ordinary fuse for the same purpose.

High density DRAMs (dynamic random access memories) are commonly designed with memory cell redundancy whereby the redundant memory cells avoid loss of an entire memory in the event that a minor number of memory cells fail to function. Redundant memory cell activation is effected by activating antifuses (or fuses) selectively placed throughout the memory.

Some examples of the fabrication of semiconductor devices with antifuse arrangements are shown in the following prior art.

[1] U.S. Pat. No. 4,635,345 (Hankins et al.), issued Jan. 13, 1987, discloses a vertical (three-dimensional), as opposed to horizontal (two-dimensional), bipolar junction transistor (BJT) structure based antifuse in an IC memory array to increase the component density on a substrate in a semiconductor device. A thin oxide fusible element (insulator portion) is provided between the emitter region of a bipolar transistor, which emitter forms a bottom electrode (bottom terminal), and a top electrode (top terminal), e.g., of aluminum. Applying a voltage, e.g., of 12–14 volts, between the top electrode and emitter blows (activates) the thin oxide antifuse, causing the top electrode to come into contact with the emitter, to change the antifuse from electrically non-conductive or "off" state to electrically conductive or "on" state. This reference does not teach an arrangement of antifuses in vertically stacked relation and sharing a common intermediate electrode therebetween in the manner of the present invention.

[2] U.S. Pat. No. 5,436,496 (Jerome et al.), issued Jul. 25, 1995, discloses a vertical BJT structure based antifuse in an IC to increase the substrate component density in a semiconductor device. Each antifuse is selectively permanently programmable after fabrication and the antifuse structure includes a buried collector, an overlying base and an emitter above the base and having a metal contact, e.g., of aluminum, at its upper surface. Heating the metal contact/emitter interface to its eutectic melting point by a current or voltage pulse causes the aluminum to short through the emitter to the base, thereby programming the antifuse. The vertical antifuse functionally changes from a floating base transistor to a diode. This reference does not teach an arrangement of antifuses in vertically stacked relation and sharing a common intermediate electrode therebetween in the manner of the present invention.

[3] U.S. Pat. No. 5,313,424 (Adams et al.), issued May 17, 1994, discloses a semiconductor substrate having an electrically blown fuse circuit based on antifuse technology. A resistance decrease, e.g., of only 50%, due to dopant redistribution, is exhibited on blowing (activating) a given fuse. A redundancy system includes circuits to test a memory array to locate a faulty element therein, a resistor to store an address of the faulty element and electrical antifuses blown in response to binary digits of the address stored in the register on applying an enable signal from a single input to the semiconductor device. Programmable redundancy is provided by sensing resistance decreases due to dopant redistribution, e.g., in a polysilicon fuse element in a programmable antifuse circuit. This reference does not teach an arrangement of antifuses in vertically stacked relation and sharing a common intermediate electrode therebetween in the manner of the present invention.

It is desirable to have an area efficient arrangement of antifuses in vertically stacked, e.g., aligned, relation and sharing a common intermediate electrode therebetween, without an area penalty, so as to increase semiconductor wafer yield and reduce costs, and especially to have a combination of different type antifuses in such arrangement, preferably with redundancy of one or more of such types of antifuses, without compromising maximum pitch reduction between laterally adjacent antifuses.

SUMMARY OF THE INVENTION

The foregoing drawbacks are obviated in accordance with the present invention, and an area efficient arrangement of antifuses is provided in vertically stacked, e.g., aligned, relation and sharing a common intermediate electrode therebetween, without an area penalty. This increases semiconductor wafer yield and reduces costs. Also, a combination of different type antifuses in such arrangement can be provided, e.g., with redundancy of one or more of such types of antifuses, without compromising maximum pitch reduction between laterally adjacent antifuses.

According to the invention apparatus is provided which comprises a semiconductor body having on a surface thereof at least one upper and at least one lower antifuse in vertically stacked, e.g., aligned, relation and sharing a common intermediate electrode therebetween. The lower antifuse has a lower counter electrode and a lower fusible insulator portion defining a lower fuse element of an initial high electrical resistance state interconnecting the lower counter electrode with the common intermediate electrode. The upper antifuse has an upper counter electrode and an upper fusible insulator portion defining an upper fuse element of an initial high electrical resistance state interconnecting the upper counter electrode with the common intermediate electrode. The upper and lower antifuses are arranged to permit their respective selective energizing for corresponding separate or simultaneous activation to a final low electrical resistance state.

Advantageously, at least one of the antifuses is provided redundantly with at least one additional antifuse in closely laterally adjacent arrangement thereto, e.g., connected in parallel therewith, and having an additional counter electrode and an additional fusible insulator portion defining an additional fuse element of an initial high electrical resistance state interconnecting the additional counter electrode with the common intermediate electrode.

Thus, the lower antifuse can be provided redundantly with at least one additional lower antifuse in closely laterally adjacent arrangement thereto and connected in parallel therewith and having an additional lower counter electrode and an additional lower fusible insulator portion defining an additional lower fuse element of an initial high electrical resistance state interconnecting the additional lower counter electrode with the common intermediate electrode.

Likewise, the upper antifuse can be provided redundantly with at least one additional upper antifuse in closely laterally adjacent arrangement thereto and connected in parallel therewith and having an additional upper counter electrode and an additional upper fusible insulator portion defining an additional upper fuse element of an initial high electrical resistance state interconnecting the additional upper counter electrode with the common intermediate electrode.

As to one particular feature, the counter electrode of at least one of the antifuses is interconnected by the corresponding fuse element to the common intermediate electrode through at least one electrode extension portion interposed between said fuse element and the common intermediate electrode.

As to another particular feature, the counter electrode of at least one of the antifuses is interconnected by the corresponding fuse element to the common intermediate electrode through at least one electrode extension portion interposed between said fuse element and the corresponding counter electrode.

According to one preferred embodiment, the lower antifuse is in the form of a gate oxide antifuse having a source region and a drain region correspondingly closely laterally adjacent the lower fusible insulator portion defining the lower fuse element, and a gate oxide electrode in contact with the lower fuse element and forming the lower counter electrode. A source conductive extension portion is interposed between the source region and the common intermediate electrode, the source conductive extension portion and source region together defining a source electrode extension portion. Also, a drain conductive extension portion is interposed between the drain region and the common intermediate electrode, the drain conductive extension portion and drain region together defining a drain electrode extension portion.

The gate electrode is interconnected by the lower fuse element with the common intermediate electrode through the source electrode extension portion and through the drain electrode extension portion.

According to another preferred embodiment, the upper antifuse is in the form of a contact (dual damascene) antifuse having an electrode extension portion defining a conductive contact interposed between the upper counter electrode and the upper fusible insulator portion defining the upper fuse element and interconnecting the upper counter electrode with the upper fuse element, the upper fuse element also being, e.g., directly, interconnected with the common intermediate electrode.

According to a further preferred embodiment, the lower antifuse is in the form of a contact (dual damascene) antifuse having an electrode extension portion defining a conductive contact interposed between the common intermediate electrode and the lower fusible insulator portion defining the lower fuse element and interconnecting the common intermediate electrode with the lower fuse element, the lower fuse element also being, e.g., directly, interconnected with the lower counter electrode. In regard to one particular feature, the lower counter electrode is in the form of a diffusion region in contact with the lower fuse element.

Advantageously, energizable fuse activation circuit means are provided which define a lower fuse activation circuit for applying and controlling a selective blow voltage across the lower counter electrode and common intermediate electrode at the lower fuse element for fusibly blowing the lower antifuse to a final low electrical resistance state to interconnect electrically conductively the lower counter electrode and the common intermediate electrode thereat.

The energizable fuse activation circuit means further define an upper fuse activation circuit for applying and controlling a selective blow voltage across the upper counter electrode and common intermediate electrode at the upper fuse element for fusibly blowing the upper antifuse to a final low electrical resistance state to interconnect electrically conductively the upper counter electrode and the common intermediate electrode thereat.

Similarly, unblown or blown fuse activation state sensing and indicating circuit means are provided. The sensing and indicating circuit means define a lower fuse state sensing and indicating circuit for sensing and indicating the unblown or blown fuse activation state of the lower antifuse, and further define an upper fuse state sensing and indicating circuit for sensing and indicating the unblown or blown fuse activation state of the upper antifuse.

The fuse activation circuit means may be arranged for independently applying and controlling a selective blow voltage for fusibly blowing the lower antifuse, and for independently applying and controlling a selective blow voltage for fusibly blowing the upper antifuse, to permit their respective selective energizing for corresponding separate fuse activation.

Alternatively, the fuse activation circuit means may be arranged for simultaneously applying and controlling a selective blow voltage for fusibly blowing both the lower antifuse and upper antifuse, to permit their selective energizing for simultaneous fuse activation. In this case, the lower antifuse and upper antifuse are connected in parallel in the fuse activation circuit.

The invention will be more readily understood from the following detailed description taken with the accompanying drawings and claims.

It is noted that the drawings are not to scale, some portions being shown exaggerated to make the drawings easier to understand.

DETAILED DESCRIPTION

Figure 1:
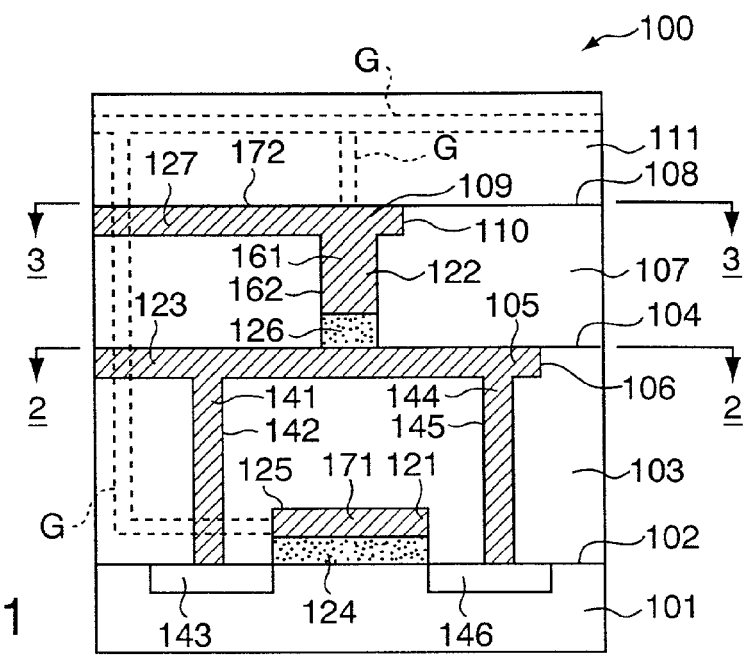
FIG. 1 is a side sectional view of an apparatus comprising a vertical stack of two different type antifuses, including a lower gate oxide antifuse and an upper contact (dual damascene) antifuse, e.g., usable for fusing operation of redundancy or custom wiring activation in a semiconductor device, in accordance with one embodiment of the invention.
Figure 2:
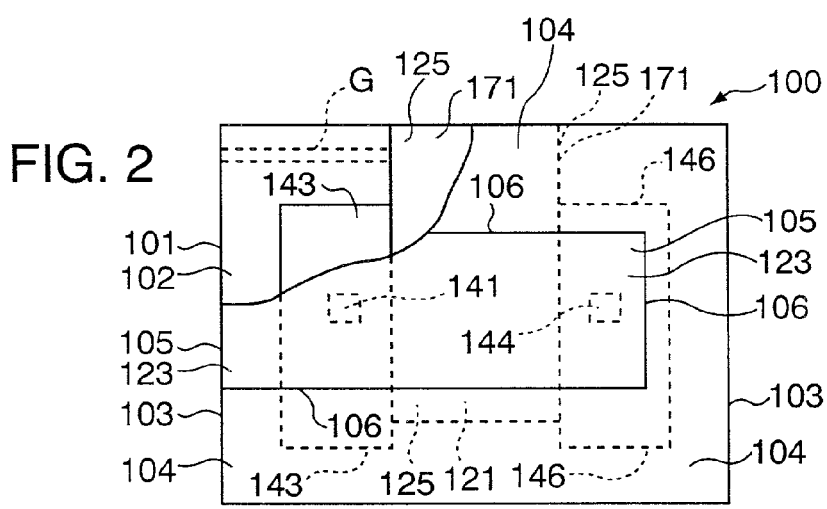
FIG. 2 is a top sectional view taken along a line 2—2 of FIG. 1, and partially broken away to show details of construction.
Figure 3:
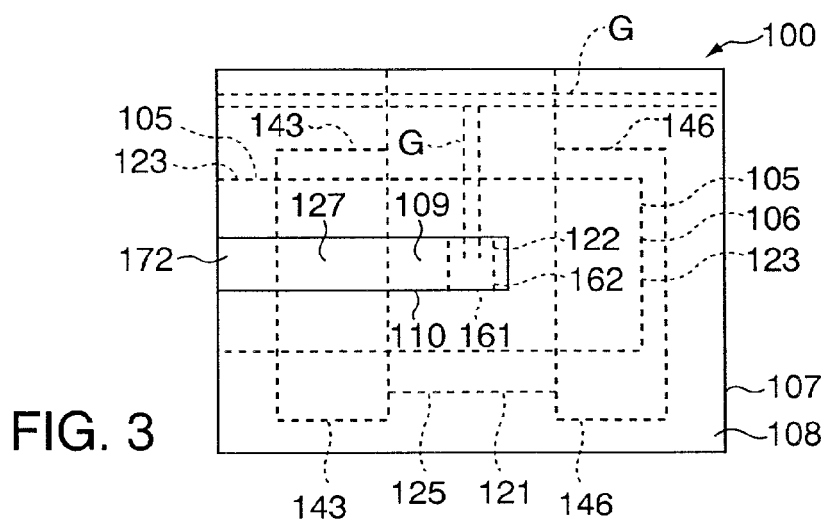
FIG. 3 is a top sectional view taken along a line 3—3 of FIG. 1.

Referring now to FIGS. 1 to 3, there is shown apparatus 100 having a vertical stack of two antifuses, especially two different type antifuses, such as a lower gate oxide antifuse and an upper contact (dual damascene) antifuse, e.g., usable for fusing operation per redundancy or custom wiring activation in accordance with one embodiment of the invention. FIG. 1 is a side sectional view; FIG. 2 is a top sectional view through a line 2—2 of FIG. 1 with a partial break-away portion; and FIG. 3 is a top sectional view through a line 3—3 of FIG. 1.

In FIGS. 1, 2, and 3 apparatus 100 comprises wafer (semiconductor body) 101, top surface 102, insulation layer 103, top surface 104, metal layer 105, trench 106, insulation layer 107, top surface 108, metal layer 109, trench 110, insulation layer 111, antifuse 121, antifuse 122, electrode 123, fuse element 124, electrode 125, fuse element 126, electrode 127, contact portion 141, via 142, region 143, contact portion 144, via 145, region 146, contact portion 161, via 162, lower antifuse circuit 171, upper antifuse circuit 172, and ground line G, as the case may be.

FIGS. 1, 2 and 3 show apparatus 100 (some details of which are indicated by dashed lines in FIGS. 2 and 3), formed of a wafer 101, e.g., of silicon, having a top surface 102, with a lower insulation layer 103, e.g., of silicon dioxide, disposed on top surface 102 of wafer 101 and having a top surface 104, and a lower metal layer 105, e.g., of tungsten, copper, aluminum, or the like, disposed in a trench 106 formed in top surface 104 of lower insulation layer 103. A middle insulation layer 107, e.g., of silicon dioxide, is disposed on top surface 104 of lower insulation layer 103 and has a top surface 108. An upper metal layer 109, e.g., of tungsten, copper, aluminum, or the like, is disposed in a trench 110 formed in top surface 108 of middle insulation layer 107, and an upper insulation layer 111, e.g., of silicon dioxide, is disposed on top surface 108 of middle insulation layer 107.

Apparatus 100 comprises an arrangement of at least two antifuses (as shown) in vertically stacked, e.g., generally vertically aligned, relation, such as a lower gate oxide antifuse 121 and an upper contact (dual damascene) antifuse 122, which share a common intermediate electrode 123 therebetween, and which are arranged to permit their respective selective energizing for corresponding separate or simultaneous fuse activation from an initial high electrical resistance state to a final low electrical resistance state.

Lower gate oxide antifuse 121 has a lower fusible insulator portion, e.g., of fusible material such as silicon dioxide, silicon nitride, or the like, formed on top surface 102 of wafer 101 and defining a thin lower gate fuse element 124 of an initial high electrical resistance state. Lower gate fuse element 124 operatively interconnects a lower counter electrode, such as a lower gate electrode 125, e.g., of polysilicon, tungsten, or the like, located in lower insulation layer 103 in overlying contact relation to lower gate fuse element 124, with common intermediate electrode 123 located in lower trench 106 defined in top surface 104 of lower insulation layer 103.

Upper contact antifuse 122 has an upper fusible insulator portion, e.g., of fusible material such as silicon dioxide, silicon nitride, or the like, formed on common intermediate electrode 123 and defining a thin upper contact fuse element 126 of an initial high electrical resistance state. Upper contact fuse element 126 operatively interconnects an upper counter electrode, such as an upper contact electrode 127 located in upper trench 110 defined in top surface 108 of middle insulation layer 107, with common intermediate electrode 123.

In particular, lower gate oxide antifuse 121 is provided with a lower source conductive extension portion such as a lower source contact portion 141, e.g., in the form of an electrically conductive wire such as of tungsten, copper, aluminum, or the like, located in a lower via 142 extending vertically through lower insulation layer 103 and interposed between lower gate fuse element 124 and common intermediate electrode 123. Lower source contact portion 141 operatively interconnects common intermediate electrode 123 with lower gate fuse element 124 through a source region 143, such as is formed by implant or diffusion doping of the portion of underlying top surface 102 of, e.g., silicon, wafer 101 which is adjacent one lateral side of lower gate fuse element 124 thereat.

Lower gate oxide antifuse 121 is also provided with a lower drain electrode extension portion such as a lower drain contact portion 144, e.g., similarly in the form of an electrically conductive wire such as of tungsten, copper, aluminum, or the like, located in a lower via 145 extending vertically through lower insulation layer 103 and interposed between lower gate fuse element 124 and common intermediate electrode 123. Lower drain contact portion 144 operatively interconnects common intermediate electrode 123 with lower gate fuse element 124 through a drain region 146, such as is formed by implant or diffusion doping of the portion of underlying top surface 102 of, e.g., silicon, wafer 101 which is adjacent the opposite lateral side of lower gate fuse element 124 thereat.

Lower source contact portion 141 plus source region 143, on the one hand, and lower drain contact portion 144 plus drain region 146, on the other hand, which are respectively located on opposite lateral sides (i.e., bilaterally) of lower fusible gate element 124, are desirably correspondingly closely laterally (i.e., bilaterally) adjacent lower fusible gate element 124 therebetween to maintain as tight a pitch as possible for the extant side by side components (i.e., extending longitudinally from left to right as viewed in FIG. 1).

In essence, lower source contact portion 141 forms a conductive extension portion interposed between common intermediate electrode 123 and source region 143, and together with source region 143 defines a lower source electrode extension portion which electrically conductively interconnects common intermediate electrode 123 with lower gate fuse element 124, in turn connected to lower gate electrode 125.

Likewise, lower drain contact portion 144 forms a conductive extension portion interposed between common intermediate electrode 123 and drain region 146, and together with drain region 146 defines a lower drain electrode extension portion which also electrically conductively interconnects common intermediate electrode 123 with lower gate fuse element 124, in turn connected to lower gate electrode 125.

Upper contact antifuse 122 is provided with an upper electrode extension portion such as an upper contact portion 161, e.g., in the form of an electrically conductive contact terminal such as of tungsten, copper, aluminum, or the like, located in an upper via 162 extending vertically through middle insulation layer 107 and interposed between upper contact fuse element 126 and upper contact electrode 127. Upper contact portion 161 operatively, e.g., directly, electrically conductively interconnects upper contact electrode 127 with upper contact fuse element 126, in turn connected to common intermediate electrode 123.

Lower gate electrode 125 forms a part of lower antifuse circuit 171 and upper contact electrode 127 forms a part of upper antifuse circuit 172, both such circuits being connected to a ground line G (indicated by dashed lines in FIGS. 1 to 3) in conventional manner. Lower gate electrode 125 and upper contact electrode 127 are each respectively connected to common intermediate electrode 123 by energizable fuse activation circuit means (see FIGS. 15 and 16) arranged for respective selective energizing of lower gate oxide antifuse 121 and upper contact antifuse 122 for corresponding separate (FIG. 15) or simultaneous (FIG. 16) fuse activation from an initial high electrical resistance state to a final low electrical resistance state.

It is noted that an electrode is a device by which an electric current passes into and out of a cell, apparatus or body. Hence, in lower gate oxide antifuse 121, lower source contact portion 141 and source region 143 together define one bilateral terminal of common intermediate electrode 123, and lower contact portion 144 and drain region 146 together define the opposite bilateral terminal of common intermediate electrode 123, i.e., with respect to lower gate fuse element 124 as such cell, apparatus or body, whereas lower gate electrode 125 itself defines both the other electrode and its sole terminal.

Moreover, in upper contact antifuse 122, upper contact portion 161 defines the sole terminal of upper contact electrode 127, i.e., with respect to upper contact fuse element 126 as such cell, apparatus or body, whereas common intermediate electrode 123 itself defines both the other electrode and its sole terminal.

Of course, wafer 101 may contain other intervening layers (not shown) below lower insulation layer 103, but preferably lower insulation layer 103 will directly overlie a layer of material such as silicon, to permit convenient fabrication of source region 143 and drain region 146 as contemplated herein. Upper insulation layer 111 conveniently serves to encapsulate protectively and planarize the vertically stacked antifuse arrangement herein.

Source region 143 and drain region 146 in top surface 102 of wafer 101 are fabricated in conventional manner, e.g., by doping per implant technique or diffusion technique.

Insulation layers 103, 107 and 111 on wafer 101, fuse element 124 on top surface 102 of wafer 101, and fuse element 126 on common intermediate electrode 123, are correspondingly provided in conventional manner, e.g., by plasma enhanced chemical vapor deposition (PECVD).

Trench 106 and vias 142 and 145 in lower insulation layer 103, and trench 110 and via 162 in middle insulation layer 107, are correspondingly provided in conventional manner, e.g., by photo-lithographic masking and etching technique.

Electrode 125, metal layers 105 and 109 which form electrodes 123 and 127, and contact portions 141, 144 and 161, as the case may be, are correspondingly provided in conventional manner, e.g., by metallization technique. As to polysilicon electrode 125, such is particularly provided by PECVD.

Lower antifuse 121 is referred to herein as a gate oxide antifuse since the related gate oxide transistor (MOS transistor) contains a gate oxide region, e.g. composed of silicon dioxide, between the gate electrode and the bilaterally arranged source and drain regions, which gate oxide region corresponds to the fusible insulator, i.e., lower gate fuse element 124, of lower antifuse 121. However, because lower fuse element 124 can be composed of non-oxide material such as silicon nitride ($Si_3N_4$) as well as of oxide material such as silicon dioxide ($SiO_2$), it is clear that lower antifuse 121 is not limited to a gate oxide construction having a lower gate fuse element 124 composed of an oxide material such as silicon dioxide, but instead also contemplates a construction having a lower gate fuse element 124 composed of non-oxide material such as silicon nitride.

It is clear that any given antifuse, such as lower antifuse 121 and/or upper antifuse 122, can be activated (blown) by applying a blow voltage across the common intermediate electrode, such as common intermediate electrode 123, and the counter electrode, such as lower electrode 125 including lower contact portions 141 and 144 plus source and drain regions 143 and 146, and/or upper electrode 127 including upper contact portion 161. This causes an electric current to pass through the given fuse element, such as lower fuse element 124 and/or upper fuse element 126, which generates an electric field in the given fuse element which damages (breaks down or causes a short in) the fuse element irreversibly so as to create an electrically conductive path between the common intermediate electrode and the given counter electrode.

Figure 4:
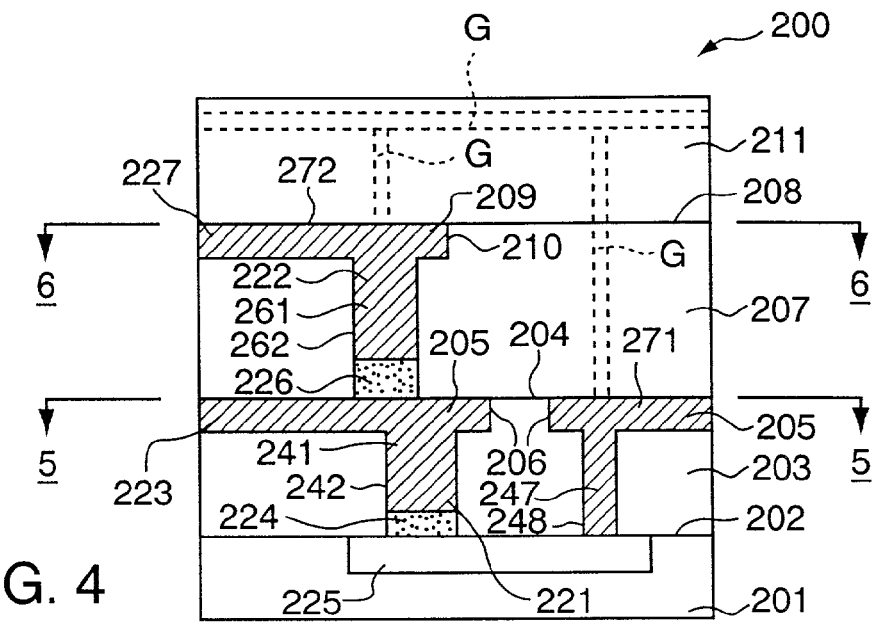
FIG. 4 is a side sectional view of an apparatus similar to that of FIG. 1, but including both lower and upper contact (dual damascene) antifuses, in accordance with another embodiment of the invention.
Figure 5:
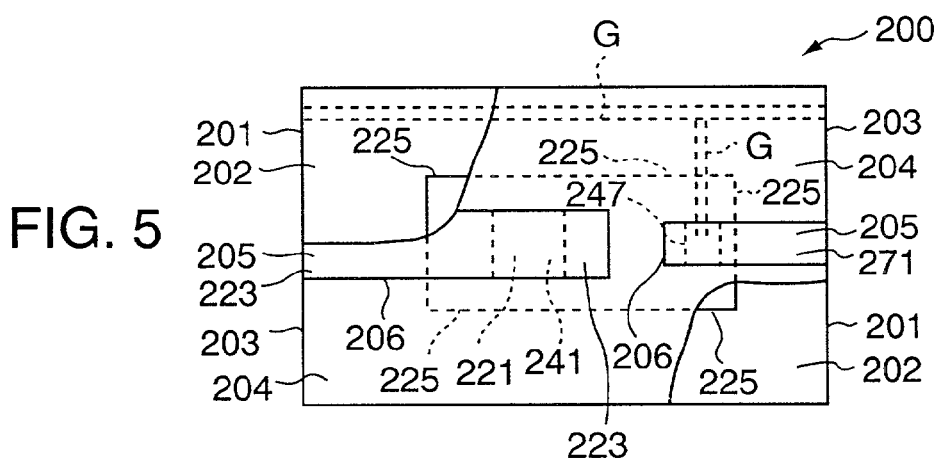
FIG. 5 is a top sectional view taken along a line 5—5 of FIG. 4, and partially broken away to show details of construction.
Figure 6:
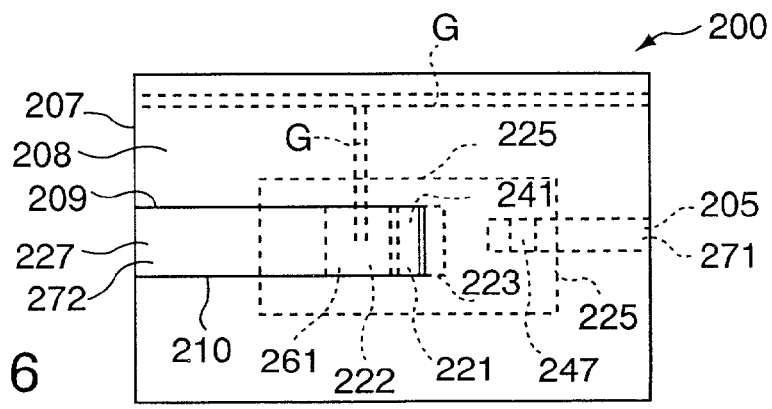
FIG. 6 is a top sectional view taken along a line 6—6 of FIG. 4.

Referring now to FIGS. 4, 5, and 6, there is shown a semiconductor device in accordance with another embodiment of the invention, having a vertical stack of two antifuses of the same general type, such as a lower contact (dual damascene) antifuse and an upper contact (dual damascene) antifuse, both similar to the upper contact antifuse of FIGS. 1, 2, and 3, and, e.g., usable for fusing operation per redundancy or custom wiring activation. FIG. 4 is a side sectional view; FIG. 5 is a top sectional view through a line 5—5 of FIG. 4 with partial break-away portions; and FIG. 6 is a top sectional view through a line 6—6 of FIG. 4.

In FIGS. 4, 5, and 6 apparatus 200 comprises wafer (semiconductor body) 201, top surface 202, insulation layer 203, top surface 204, metal layer 205, trench 206, insulation layer 207, top surface 208, metal layer 209, trench 210, insulation layer 211, antifuse 221, antifuse 222, electrode 223, fuse element 224, electrode 225, fuse element 226, electrode 227, contact portion 241, via 242, extension portion 247, via 248, contact portion 261, via 262, lower antifuse circuit 271, upper antifuse circuit 272, and ground line G, as the case may be.

Parts 201 to 211, 222 to 223, 226 to 227, 261 to 262, 271 to 272, and G in FIGS. 4 to 6 are the same as parts 101 to 111, 121 to 127, 141 to 142, 161 to 262, 171 to 172, and G in FIGS. 1 to 3, while parts 221, 224 to 225, 241 to 242, 247 and 248 are different parts.

Specifically, semiconductor device 200 (some details of which are indicated by dashed lines in FIGS. 5 and 6) is formed of a wafer 201, e.g., of silicon, having a top surface 202, with a lower insulation layer 203, e.g., of silicon dioxide, disposed on top surface 202 of wafer 201 and having a top surface 204, and a lower metal layer 205, e.g., of tungsten, copper, aluminum, or the like, disposed in corresponding trenches 206 formed in top surface 204 of lower insulation layer 203. A middle insulation layer 207, e.g., of silicon dioxide, is disposed on top surface 204 of lower insulation layer 203 and has a top surface 208. An upper metal layer 209, e.g., of tungsten, copper, aluminum, or the like, is disposed in a trench 210 formed in top surface 208 of middle insulation layer 207, and an upper insulation layer 211, e.g., of silicon dioxide, is disposed on top surface 208 of middle insulation layer 207.

Semiconductor device 200 contains an arrangement of at least two antifuses (as shown) of the same type in vertically stacked, e.g., generally vertically aligned, relation, such as a lower contact (dual damascene) antifuse 221 and an upper contact (dual damascene) antifuse 222, which share a common intermediate electrode 223 therebetween, and which are arranged to permit their respective selective energizing for corresponding separate or simultaneous fuse activation from an initial high electrical resistance state to a final low electrical resistance state.

Lower contact antifuse 221 has a lower fusible insulator portion, e.g., of fusible material such as silicon dioxide, silicon nitride, or the like, formed on top surface 202 of wafer 201 and defining a thin lower contact fuse element 224 of an initial high electrical resistance state. Lower contact fuse element 224 operatively interconnects a lower counter electrode, such as a lower contact electrode 225 formed as a diffusion region by implant or diffusion doping of the portion of underlying top surface 202 of, e.g., silicon, wafer 201 in underlying contact relation to lower contact fuse element 224 thereat, with common intermediate electrode 223. Common intermediate electrode 223 is located in a lower trench 206 defined in top surface 204 of lower insulation layer 203.

Upper contact antifuse 222 has an upper fusible insulator portion, e.g., of fusible material such as silicon dioxide, silicon nitride, or the like, defining a thin upper contact fuse element 226 of an initial high electrical resistance state. Upper contact fuse element 226 operatively interconnects an upper counter electrode, such as an upper contact electrode 227 located in upper trench 210 defined in top surface 208 of middle insulation layer 207, with common intermediate electrode 123.

In particular, lower contact antifuse 221 is provided with a lower electrode extension portion such as a lower contact portion 241, e.g., in the form of an electrically conductive contact terminal such as of tungsten, copper, aluminum, or the like, located in a lower via 242 extending vertically through lower insulation layer 203 and interposed between lower contact fuse element 224 and common intermediate electrode 223. Lower contact portion 241 operatively, e.g., directly, electrically conductively interconnects common intermediate electrode 223 with lower contact fuse element 224, in turn connected to lower contact electrode 225.

Upper contact antifuse 222 is provided with an upper electrode extension portion such as an upper contact portion 261, e.g., in the form of an electrically conductive contact terminal such as of tungsten, copper, aluminum, or the like, located in an upper via 262 extending vertically through middle insulation layer 207 and interposed between upper contact fuse element 226 and upper contact electrode 227. Upper contact portion 261 operatively, e.g., directly, electrically conductively interconnects upper contact electrode 227 with upper contact fuse element 226, in turn connected to common intermediate electrode 223.

Lower contact electrode 225 is connected by a lower conductive extension portion 247 such as of tungsten, copper, aluminum, or the like, located in a lower via 248 extending vertically through lower insulation layer 203 to a separate portion of metal layer 205 located in a separate lower trench 206 in top surface 204 of lower insulation layer 203.

Lower contact electrode 225 and lower conductive extension portion 247 form a part of lower antifuse circuit 271 and upper contact electrode 227 forms a part of upper antifuse circuit 272, both such circuits being connected to ground line G (indicated by dashed lines in FIGS. 4 to 6) in conventional manner. Lower contact electrode 225 and upper contact electrode 227 are each respectively connected to common intermediate electrode 223 by energizable fuse actuation circuit means (see FIGS. 15 and 16) arranged for respective selective energizing of lower contact antifuse 221 and upper contact antifuse 222 for corresponding separate (FIG. 15) or simultaneous (FIG. 16) fuse activation from an initial high electrical resistance state to a final low electrical resistance state.

As noted above, given that an electrode is a device by which an electric current passes into and out of a cell, apparatus or body, it is clear that in lower contact antifuse 221, lower contact portion 241 defines the sole terminal of common intermediate electrode 223, i.e., with respect to lower contact fuse element 224, whereas lower counter electrode 225 itself defines both the other electrode and its sole terminal.

Moreover, it is clear that in upper contact antifuse 222, upper contact portion 261 defines the sole terminal of upper contact electrode 227, i.e., with respect to upper contact fuse element 226 as such cell, apparatus or body, whereas common intermediate electrode 223 itself defines both the other electrode and its sole terminal.

Wafer 201 may contain other intervening layers (not shown) below lower insulation layer 203, but preferably lower insulation layer 203 will directly overlie a layer of material such as silicon, to permit convenient fabrication of the diffusion region defining lower contact electrode 225 as contemplated herein. Upper insulation layer 211 conveniently serves to encapsulate protectively and planarize the vertically stacked antifuse arrangement herein.

The diffusion region defining lower contact electrode 225 in surface 202 of wafer 201 is provided in conventional manner, e.g., by doping per implant technique or diffusion technique.

Insulation layers 203, 207 and 211 on wafer 201, fuse element 224 on top surface 202 of wafer 201, and fuse element 226 on common intermediate electrode 223, are provided correspondingly in conventional manner, e.g., by PECVD.

Moreover, trench 206 and vias 242 and 248 in lower insulation layer 203, and trench 210 and via 262 in middle insulation layer 207, are correspondingly provided in conventional manner, e.g., by photo-lithographic masking and etching technique.

Likewise, metal layers 205 and 209 which form electrodes 223 and 227, and contact portions 241 and 261, as well as conductive extension portion 247, as the case may be, are correspondingly provided in conventional manner, e.g., by metallization technique.

Figure 7:
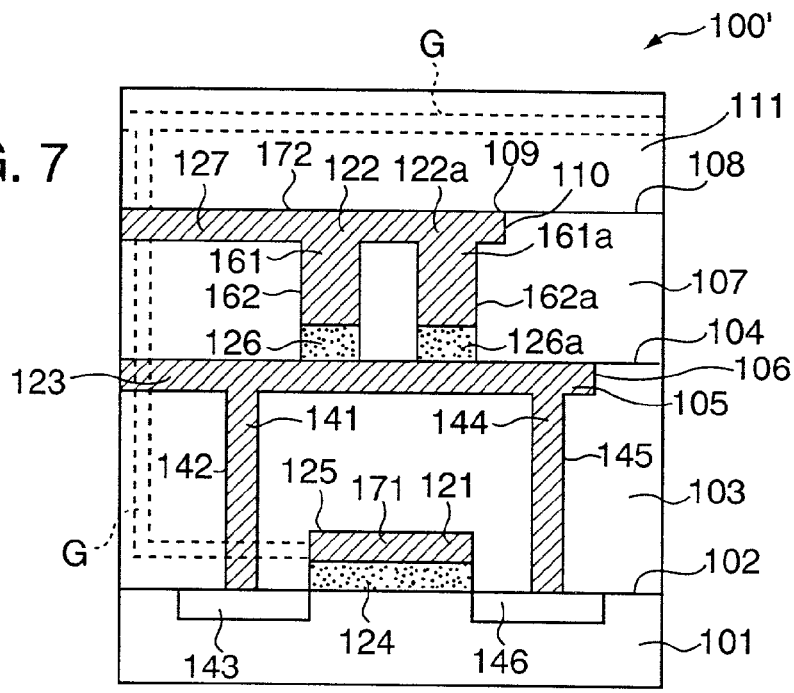
FIG. 7 is a side sectional view of an apparatus corresponding to that of FIG. 1, but including more than one upper contact antifuse, in accordance with still another embodiment of the invention.

Referring now to FIG. 7, there is shown a side sectional view of apparatus (a semiconductor device) 100' in accordance with still another embodiment of the invention, corresponding to that of FIGS. 1 to 3, but including more than one upper contact antifuse and, e.g., usable for fusing operation per redundancy or custom wiring activation.

In apparatus 100' the parts 101 to 111, 121 to 127, 141 to 146, 161 to 162, 171 to 172, and ground line G, as the case may be, are the same as those of apparatus 100 in FIGS. 1, 2, and 3. Apparatus 100' also comprises upper contact antifuse 122a, upper contact fuse element 126a, upper contact portion 161a and upper via 162a, which are correspondingly the same as upper contact antifuse 122, upper contact fuse element 126, upper contact portion 161 and upper via 162.

Specifically, apparatus 100' is formed in the same way as apparatus 100 in FIGS. 1, 2, and 3, but with an additional upper contact antifuse 122a, connected in parallel with upper contact antifuse 122, such that upper contact fuse element 126a operatively interconnects common intermediate electrode 123 therebelow with upper contact electrode 127 thereabove. Upper contact antifuse 122a serves as a redundant upper contact antifuse relative to upper contact antifuse 122 in closely laterally adjacent side by side relation thereto for achieving increased component density without an area penalty.

Figure 8:
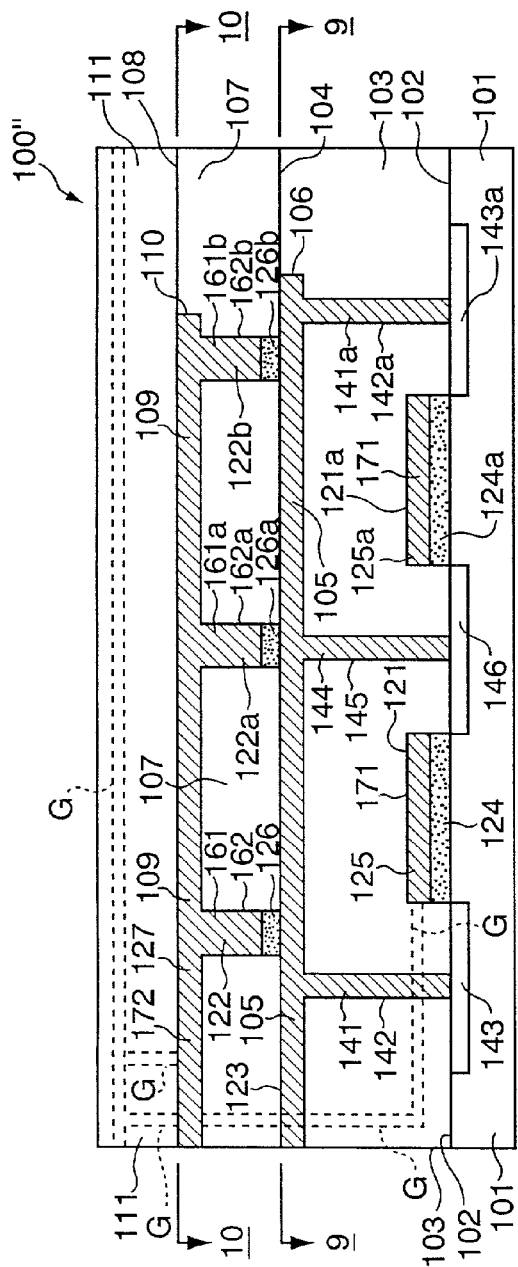
FIG. 8 is a side sectional view of an apparatus corresponding to that of FIG. 7, but including more than one upper contact antifuse as well as more than one lower gate oxide antifuse, in accordance with a further embodiment of the invention.
Figure 9:
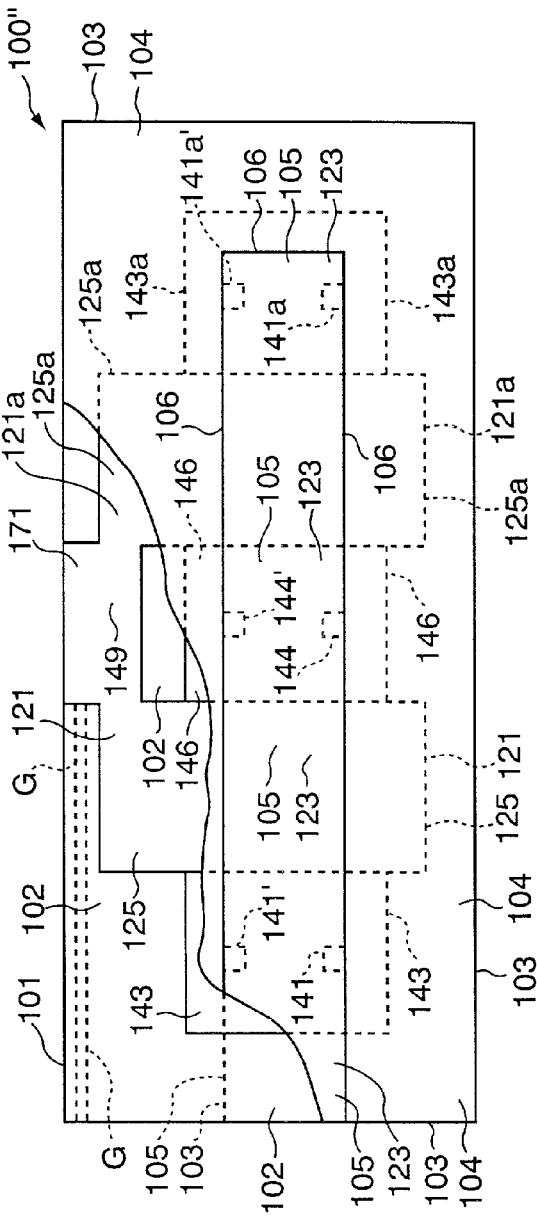
FIG. 9 is a top sectional view taken along a line 9—9 of FIG. 8, and partially broken away to show details of construction.
Figure 10:
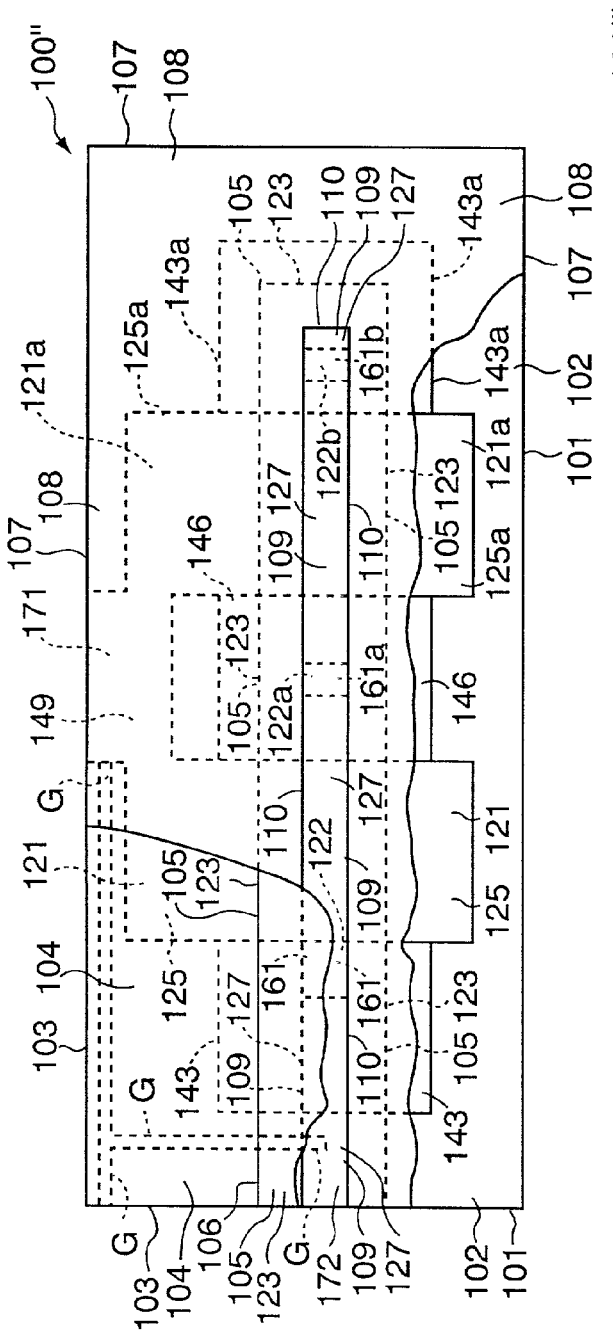
FIG. 10 is a top sectional view taken along a line 10—10 of FIG. 8, and partially broken away to show details of construction.

Referring now to FIGS. 8, 9, and 10, there is shown an apparatus (semiconductor device) 100" in accordance with still another embodiment of the invention, corresponding to that of FIGS. 1, 2, and 3, but including more than one lower gate oxide antifuse, and also more than one upper contact antifuse in the same way as in FIG. 7, and, e.g., usable for fusing operation per redundancy or custom wiring activation. FIG. 8 is a side sectional view; FIG. 9 is a top sectional view through a line 9—9 of FIG. 8 with a partial break away portion; and FIG. 10 is a top sectional view through a line 10—10 of FIG. 8 with partial break-away portions.

FIGS. 8, 9, and 10 include apparatus 100" in which, as the case may be, parts 101 to 111, 121 to 127, 141 to 146, 161 to 162, 171 to 172, and G are the same as those of apparatus 100 in FIGS. 1, 2, and 3, and in which per FIGS. 9 and 10 an interconnector 149 is also included.

Apparatus 100" further comprises lower gate oxide antifuse 121a, upper contact antifuses 122a and 122b, lower gate fuse element 124a, lower gate electrode 125a, upper contact fuse elements 126a and 126b, lower source contact portion 141a, lower via 142a, source region 143a, upper contact portions 161a and 161b, and upper vias 162a and 162b, which are correspondingly the same as lower gate oxide antifuse 121, upper contact antifuse 122, lower gate fuse element 124, lower gate electrode 125, upper contact fuse element 126, lower source contact portion 141, lower via 142, source region 143, upper contact portion 161 and upper via 162, as the case may be.

Still further included, per FIG. 9, are redundant contact portions 141', 144' and 141a', which are correspondingly the same as contact portions 141, 144 and 141a.

Upper contact antifuse 122a, upper contact fuse element 126a, upper contact portion 161a and upper via 162a, are also the same as these parts in semiconductor device 100' in FIG. 7.

Specifically, apparatus 100" (some details of which are indicated by dashed lines in FIGS. 9 and 10) is formed in the same way as apparatus 100 in FIGS. 1, 2, and 3, but with one additional lower gate oxide antifuse 121a, connected in parallel with lower gate oxide antifuse 121, and with two additional upper contact antifuses 122a and 122b, connected in parallel with upper contact antifuse 122, it being noted that upper contact antifuse 122a in FIGS. 8 to 10 is the same as in FIG. 7.

Lower gate oxide antifuse 121a has a lower source contact portion 141a in lower via 142a operatively interconnecting its lower gate fuse element 124a through its source region 143a with common intermediate electrode 123. However, it shares lower drain contact portion 144 in lower via 145 and drain region 146 in common with lower gate oxide antifuse 121, for operatively interconnecting its lower gate fuse element 124a through drain region 146 with common intermediate electrode 123. Lower gate oxide antifuse 121a serves as a redundant lower gate oxide antifuse relative to lower gate oxide antifuse 121 in closely laterally adjacent side by side relation thereto for achieving increased component density without an area penalty.

Each of upper fuse elements 126a and 126b of upper contact antifuses 122a and 122b, respectively, operatively interconnects common intermediate electrode 123 therebelow with upper contact electrode 127 thereabove. Each of upper contact antifuses 122a and 122b serves as a redundant upper contact antifuse relative to upper contact antifuse 122 in closely laterally adjacent side by side relation thereto for achieving increased component density without an area penalty.

FIG. 8 shows that upper contact portions 161, 161a and 161b individually interconnect in parallel upper contact electrode 127 in upper antifuse circuit 172 with upper contact fuse elements 126, 126a and 126b, respectively, and that in turn upper contact fuse elements 126, 126a and 126b correspondingly directly individually operatively interconnect in parallel upper contact portions 161, 161a and 161b with common intermediate electrode 123, thereby connecting in parallel upper contact antifuses 122, 122a and 122b.

Similarly, FIGS. 9 and 10 show that lower gate electrodes 125 and 125a are interconnected in parallel by an interconnector 149 in turn connected to lower antifuse circuit 171.

Of course, per FIG. 9, lower gate electrodes 125 and 125a are correspondingly directly connected to lower gate fuse elements 124 and 124a in parallel with each other. In turn, lower gate fuse element 124 is bilaterally connected with common intermediate electrode 123, through source region 143 and lower source contact portion 141, and drain region 146 and lower drain contact portion 144, as regards lower gate oxide antifuse 121. Also, lower gate fuse element 124a is bilaterally connected with common intermediate electrode 123, through source region 143a and lower source contact portion 141a, and drain region 146 and lower drain contact portion 144, as regards lower gate oxide antifuse 121a.

The resultant connection of lower gate fuse element 124 with common intermediate electrode 123 and the resultant connection of lower gate fuse element 124a with common intermediate electrode 123 represent parallel connections, such that lower gate oxide antifuse 121 and lower gate oxide antifuse 121a are connected in parallel with each other.

Advantageously, as is clear from FIG. 9, redundant contact portions 141', 144' and 141a', are correspondingly the same as contact portions 141, 144 and 143, and serve as additional redundant parallel connections between lower gate electrodes 125 and 125a and common intermediate electrode 123, i.e., through lower gate fuse elements 124 and 124a, and source regions 143 and 143a, and drain region 146, as the case may be, regarding lower gate oxide antifuses 121 and 121a.

Figure 11:
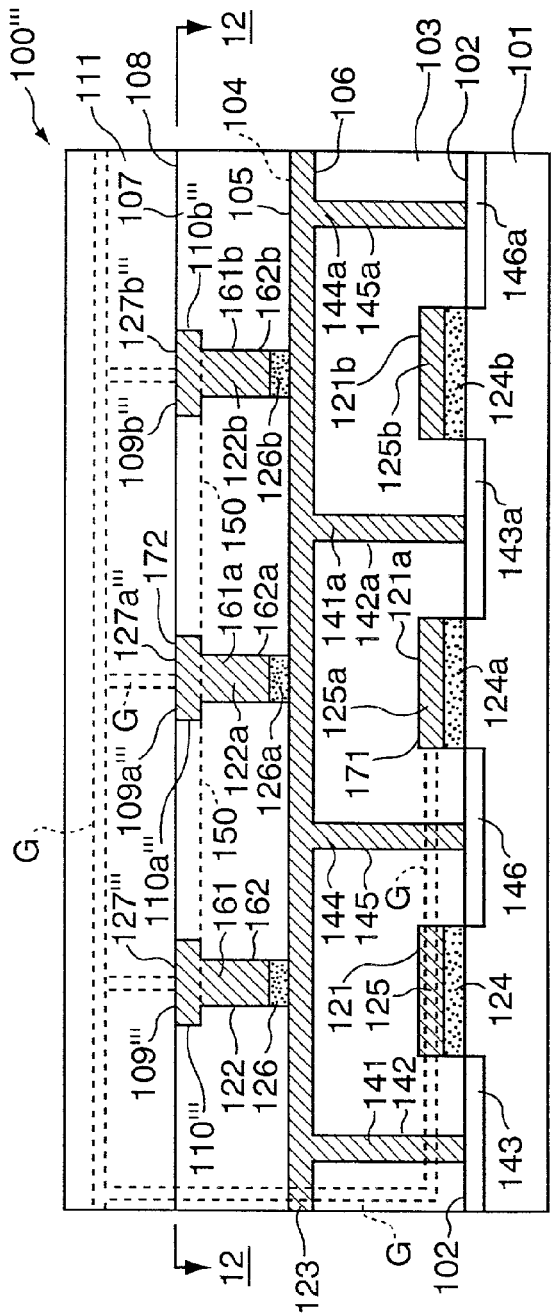
FIG. 11 is a side sectional view of an apparatus similar to that of FIGS. 8 to 10, but including a plurality of lower gate oxide antifuses arranged to form a longitudinal bank of like lower antifuses as well as a plurality of upper contact antifuses arranged to form a similar longitudinal bank of like upper antifuses, in accordance with a still further embodiment of the invention.
Figure 12:
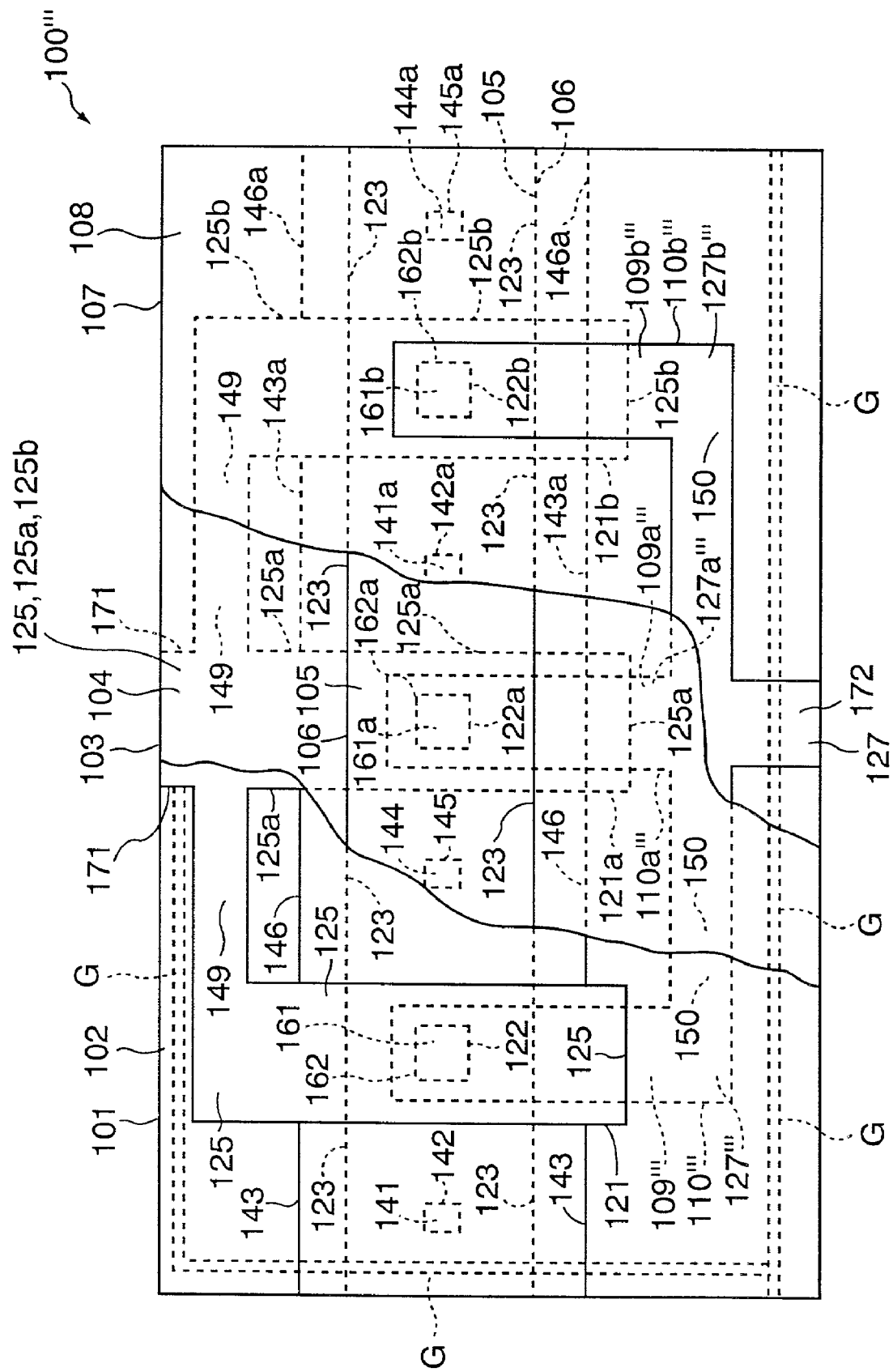
FIG. 12 is a top sectional view taken along a line 12—12 of FIG. 11, and partially broken away to show details of construction.

Referring now to FIGS. 11 and 12, there is shown an apparatus (semiconductor device) 100"' in accordance with a still further embodiment of the invention, corresponding to that of FIGS. 1, 2, and 3 and similar to that of FIGS. 8, 9, and 10, but including a plurality of lower gate antifuses arranged to form a longitudinal bank of like lower antifuses and also a plurality of upper contact antifuses arranged to form a similar bank of like upper antifuses and, e.g., usable for fusing operation per redundancy or custom wiring activation. FIG. 11 is a side sectional view and FIG. 12 is a top sectional view through a line 12—12 of FIG. 11 with partial break-away portions.

FIGS. 11 and 12 include apparatus 100"' in which parts 101 to 108, 111, 121 to 126, 141 to 146, 161 to 162, 171 to 172, and G are the same as those of semiconductor device 100 in FIGS. 1, 2, and 3 and of apparatus 100" in FIGS. 8, 9, and 10. Parts 121a, 122a, 122b, 124a, 125a, 126a, 126b, 141*a*, 142*a*, 143*a*, 161*a*, 161*b*, 162*a*, and 162*b*, plus 149, are the same as those of semiconductor device 100" in FIGS. 8, 9, and 10.

Parts 109'", 109*a*'", 109*b*"', 110"', 110*a*"', 110*b*"', 121*b*, 124*b*, 125*b*, 127"', 127*a*"', 127*b*"', 144*a*, 145*a* and 146*a* redundantly correspond to parts 109, 110, 121, 124, 125, 127, 144, 145 and 146 of apparatus 100 in FIGS. 1 to 3, and to parts 121*a*, 124*a* and 125*a* of apparatus 100" in FIGS. 8, 9 and 10, as the case may be. Apparatus 100"' further comprises interconnector 150.

Specifically, apparatus 100"' is formed in the same way as apparatus 100 in FIGS. 1, 2, and 3, but with a plurality of lower gate oxide antifuses, e.g., two additional lower gate oxide antifuses 121*a* and 121*b*, connected in parallel with lower gate oxide antifuse 121, and with a plurality of upper contact antifuses, e.g., two additional upper contact antifuses 122*a* and 122*b*, connected in parallel with upper contact antifuse 122.

Lower gate oxide antifuses 121 and 121*a* are arranged in the same way as in FIGS. 8 to 10. Similarly, lower gate oxide antifuse 121*b* has a lower drain contact portion 144*a* in lower via 145*a* operatively interconnecting its lower gate fuse element 124*b* through its drain region 146*a* with common intermediate electrode 123. However, it shares lower source contact portion 141*a* in lower via 142*a* and source region 143*a* in common with lower gate oxide antifuse 121*a*, for operatively interconnecting its lower gate fuse element 124*b* through source region 143*a* with common intermediate electrode 123.

As is clear from FIG. 12 (some details of which are indicated by dashed lines), lower gate electrodes 125, 125*a* and 125*b* are interconnected in parallel by interconnector 149 to form a combined lower gate electrode 125, 125*a*, 125*b* as part of lower antifuse circuit 171.

Lower gate oxide antifuses 121*a* and 121*b* serve as redundant lower gate oxide antifuses relative to lower gate oxide antifuse 121 in closely laterally adjacent side by side relation thereto for achieving increased component density without an area penalty.

Upper contact antifuses 122, 122*a* and 122*b* are arranged in the same way as in FIGS. 8 to 10. However, in this case the arrangement of upper contact electrode 127 of upper metal layer 109 in upper trench 110 of middle insulation layer 107 is modified by use of an arrangement of three individual side by side upper contact electrodes 127"', 127*a*"' and 127*b*"' of three individual associated metal layers, or more particularly metal layer portions, 109"', 109*a*"' and 109*b*"' in three corresponding upper trenches 110"', 110*a*"' and 110*b*"'. Upper contact electrodes 127"', 127*a*"' and 127*b*"' are interconnected in parallel by interconnector 150 to form upper contact electrode 127 as part of upper antifuse circuit 172.

Upper contact antifuses 122*a* and 122*b* serve as redundant upper contact antifuses relative to upper contact antifuse 122 in closely laterally adjacent side by side relation thereto for achieving increased component density without an area penalty.

As shown in FIG. 12, lower gate oxide antifuses 121, 121*a* and 121*b* are arranged in crosswise relation to common intermediate electrode 123 so as to form a lower bank of antifuses situated in side by side disposition along a longitudinal portion of common intermediate electrode 123 thereat.

As also shown in FIG. 12, upper contact antifuses 122, 122*a* and 122*b* are likewise arranged in crosswise relation to common intermediate electrode 123 so as to form an upper bank of antifuses situated in side by side disposition along a longitudinal portion of common intermediate electrode 123 thereat.

FIG. 12 shows that, per interconnector 149, lower gate electrodes 125, 125*a* and 125*b* define a combined lower gate electrode 125, 125*a*, 125*b* forming a portion of lower antifuse circuit 171 (extending toward the top of FIG. 12), whereas, per interconnector 150, upper contact electrodes 127"', 127*a*"' and 127*b*"' define a combined upper contact electrode 127 forming a portion of upper antifuse circuit 172 (extending toward the bottom of FIG. 12).

The vertical stacked relation of lower antifuses and upper antifuses having a common intermediate electrode permits the convenient inclusion of ground line G (shown by dashed lines in FIGS. 11 and 12), e.g., at a level corresponding to upper contact electrodes 127"', 127*a*"' and 127*b*"', and in close proximity thereto for facilitated connection of ground line G with antifuse circuit 172 via upper contact electrode 127 thereat. Such vertical stacked relation similarly facilitates the connection of ground line G with lower antifuse 171 via lower gate electrodes 125, 125*a* and 125*b*, interconnected in parallel by interconnector 149 to define a common lower gate electrode 125, 125*a*, 125*b*.

Figure 13:
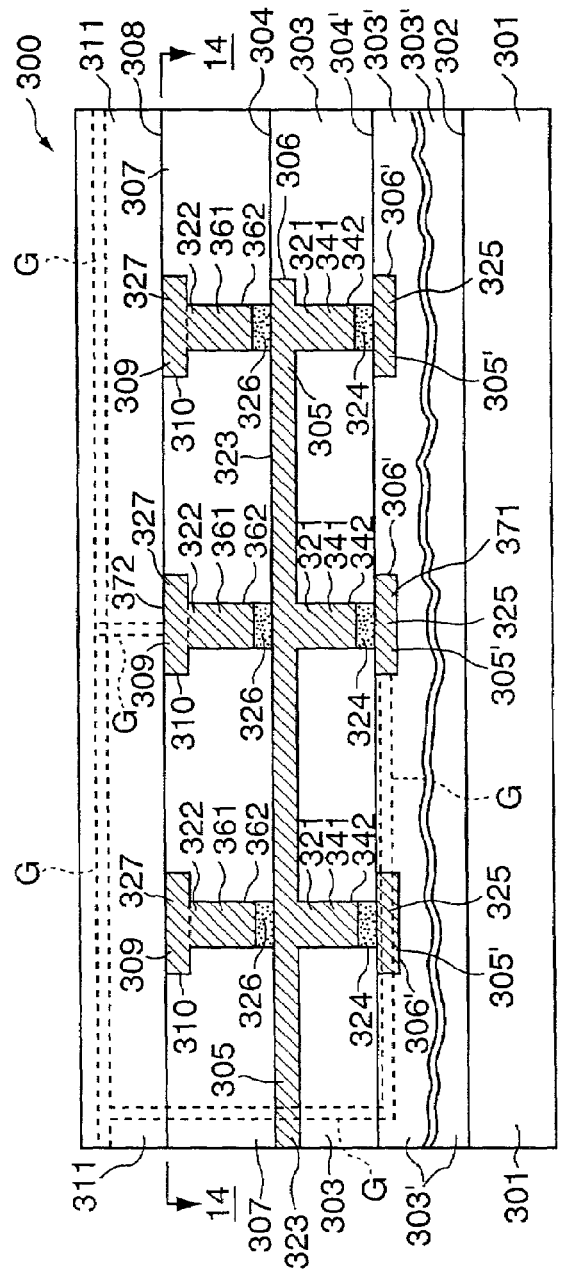
FIG. 13 is a side sectional view of an apparatus similar to that of FIGS. 8 to 10, but including a plurality of lower contact antifuses arranged to form a longitudinal bank of like lower antifuses as well as a plurality of upper contact antifuses arranged to form a similar longitudinal bank of like upper antifuses, in accordance with a modified embodiment of the invention.
Figure 14:
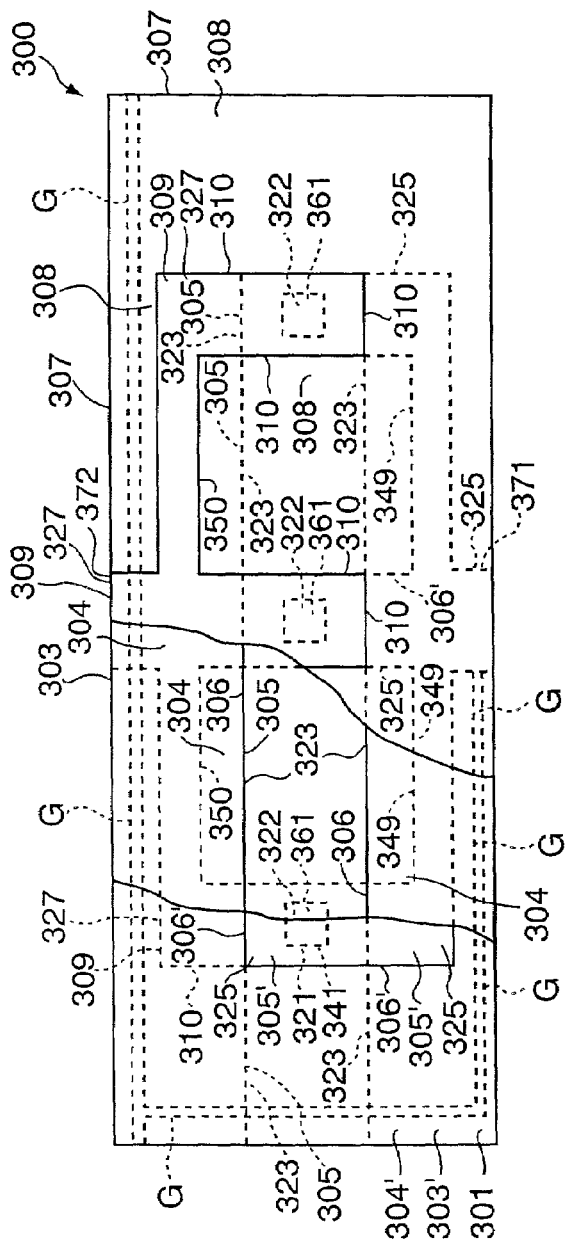
FIG. 14 is a top sectional view taken along a line 14—14 of FIG. 13, and partially broken away to show details of construction.

Referring now to FIGS. 13 and 14, there is shown an apparatus (semiconductor device) 300 in accordance with a modified embodiment of the invention, corresponding to that of FIGS. 1, 2, and 3 and similar to that of FIGS. 8, 9, and 10, and especially to that of FIGS. 11 and 12, but including a plurality of, e.g., three, lower contact antifuses, instead of gate oxide antifuses, arranged to form a longitudinal bank of like lower antifuses and also a plurality of, e.g., three, upper contact antifuses arranged to form a similar bank of like upper antifuses and, e.g., usable for fusing operation per redundancy or custom wiring activation. FIG. 13 is a side sectional view and FIG. 14 is a top sectional view through a line 14—14 of FIG. 13.

FIGS. 13 and 14 include apparatus 300 in which parts 301 to 311, 321 to 327, 341 to 342, 349 to 350, 361 to 362, 371 to 372, and G are equivalent to those of semiconductor device 100 in FIGS. 1 to 3 and of semiconductor device 100" in FIGS. 8 to 10, with parts 349 and 350 corresponding to parts 149 and 150 of FIGS. 8 to 10. In particular, there are three each of redundancy parts 309, 310, 321, 322, 324, 325, 326, 327, 341, 342, 361 and 362, and one each of the remaining such parts 301 to 308, 311, 323, 349, 350, and 371 and 372.

Apparatus 300 further comprises an insulation sub-layer 303' having a top layer 304' containing three metal sub-layers, or more particularly metal sub-layer portions, 305', 305', 305' in three corresponding trenches 306', 306', 306' thereof.

Apparatus 300 is formed in the same way as apparatus 100 in FIGS. 1, 2, and 3, but wafer 301 is provided on its top surface 302 with one or more intervening layers including an intervening insulation sub-layer 303' located immediately below lower insulation layer 303. Insulation sub-layer 303' may be made of the same material, e.g., silicon dioxide, as lower insulation layer 303, and has a top surface 304' provided with three metal sub-layers, or more specifically, three metal sub-layer portions, 305', 305', 305', in three trenches 306', 306', 306' formed in top surface 304', so as to provide a closely laterally adjacent side by side arrangement thereat of lower contact electrodes 325, 325, 325. Metal sub-layer portions 305', 305', 305', and more particularly lower contact electrodes 325, 325, 325, form connections, via lower interconnector 349, to lower antifuse circuit 371.

The three lower contact antifuses 321, 321, 321, correspondingly include lower contact portions 341, 341, 341 in vias 342, 342, 342 defined in lower insulation layer 303 which are operatively connected at their lower end portions by thin lower contact fuse elements 324, 324, 324 with lower contact electrodes 325, 325, 325. Lower contact portions 341, 341, 341 are directly connected at their upper end portions with common intermediate electrode 323 located in trench 306 of lower insulation layer 303.

The three upper contact antifuses 322, 322, 322, correspondingly include upper contact portions 361, 361, 361 in vias 362, 362, 362 defined in middle insulation layer 307 which are operatively connected at their lower end portions by thin upper contact fuse elements 326, 326, 326 with common intermediate electrode 323. Upper contact portions 361, 361, 361 are directly connected at their upper end portions with three upper contact electrodes 327, 327, 327 located in trenches 310, 310, 310 in top surface 308 of middle insulation layer 307 and formed from three metal sub-layers, or more specifically, three metal sub-layer portions, 309, 309, 309, thus providing a closely laterally adjacent side by side arrangement thereat of upper contact electrodes 327, 327, 327. Metal sub-layer portions 309, 309, 309, and more particularly upper contact electrodes 327, 327, 327, form connections, via upper interconnector 350, to upper antifuse circuit 372.

Lower contact antifuses 321, 321, 321 are desirably connected in parallel with each other, and upper contact antifuses 322, 322, 322 are also desirably connected in parallel with each other. Optionally, some or all of lower contact antifuses 321, 321, 321 can be connected in parallel with some or all of upper contact antifuses 323, 323, 323.

The lower antifuses and upper antifuses thus serve as redundant antifuses for one another, as the case may be, with the lower antifuses being disposed in closely laterally adjacent side by side relation to each other, and with the upper antifuses being disposed in like closely laterally adjacent side by side relation to each other for achieving increased component density without an area penalty.

As shown in FIG. 14 (some details of which are indicated by dashed lines), lower contact antifuses 321, 321, 321 are arranged in crosswise relation to common intermediate electrode 323 so as to form a lower bank of antifuses situated in side by side disposition along a longitudinal portion of common intermediate electrode 323 threat.

As also shown in FIG. 14, upper contact antifuses 322, 322, 322 are likewise arranged in crosswise relation to common intermediate electrode 323 so as to form an upper bank of antifuses situated in side by side disposition along a longitudinal portion of common intermediate electrode 323 thereat.

FIG. 14 shows that lower contact electrodes 325, 325, 325 form corresponding portions of lower antifuse circuit 371 (extending toward the bottom of FIG. 14), connected to ground line G (indicated in dashed line in FIG. 14), whereas upper contact electrodes 322, 322, 322 form corresponding portions of upper antifuse circuit 372 (extending toward the top of FIG. 14), also connected to such ground line G.

Figure 15:
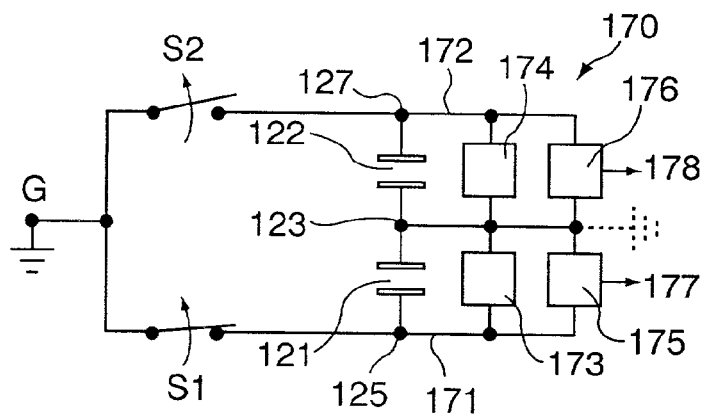
FIG. 15 is a schematic view of a circuit arrangement for independent activation of antifuses selectively according to the invention.

Referring now to FIG. 15, there is shown in block form and schematic form circuitry 170 for independent activation (blowing), per conventional technique, selectively of one or more (parallel connected) lower antifuses (e.g., antifuse 121 of FIGS. 1, 2, and 3) and separately of one or more (parallel connected) upper antifuses (e.g., antifuse 122 of FIGS. 1, 2, and 3) according to the invention, including one or all of the lower antifuses and separately one or all of the upper antifuses, per the embodiments of FIGS. 1 to 3, 4 to 6, 7, 8 to 10, 11 to 12 and 13 to 14. Circuitry 170 comprises a lower antifuse circuit 171, an upper antifuse circuit 172, a lower fuse blow circuit 173, an upper fuse blow circuit 174, a lower fuse state sensing and indicating circuit 175, an upper fuse state sensing and indicating circuit 176, a switch S1, and a switch S2. In one illustrative example, switch S1 is shown in a closed position and switch S2 is shown in an open position. Upper fuse state sensing and indicating circuit 176 has an output 178, and lower fuse state sensing and indicating circuit 175 has an output 177.

A first terminal 127 (see, also FIGS. 1, 2, and 3) of upper antifuse 122 (shown as a capacitor having parallel plates) is coupled to a first terminal of switch S2, the upper fuse blow circuit 174, and the upper fuse state sensing and indicating circuit 176. A first terminal 125 (see, also FIGS. 1, 2, and 3) of lower antifuse 121 (shown as a capacitor having parallel plates) is coupled to a first terminal of switch S1, the lower fuse blow circuit 173, and the lower fuse state sensing and indicating circuit 177. Second terminals 123 of antifuses 121 and 122 are coupled to the first and second upper and lower fuse blow circuits 174 and 173 and to the upper and lower fuse state sensing and indicating circuits 176 and 175. Second terminals of switches S1 and S2 are coupled to a reference potential terminal which is shown at ground potential G. Optionally, terminal 123 can be coupled to a reference potential terminal which is shown as a dashed line ground potential. With terminal 123 coupled to ground potential, switches S1 and S2 are not used.

In a presently preferred operation one of the antifuses 121 or 122 has a high voltage applied to terminal 123 while the switch coupled thereto is closed. For example, switch S1 is closed and switch S2 is open while a high voltage, e.g., +6 volts, is applied to terminal 123 by the lower fuse blow circuit 173. This fusibly blows the antifuse 121 which causes it to go from an initial high electrical resistance state to a final low electrical resistance state so as to electrically connect its two terminals 123 and 125 together. This operation has essentially no effect on the state of antifuse 122 which stays in its high resistance normally "off" state. Antifuse 122 is blown by closing switch S2 and opening switch S1. Then a high voltage is applied by upper fuse blow circuit 174 to terminal 123. This fusibly blows the antifuse 122 which causes it to go from an initial high electrical resistance state to a final low electrical resistance state so as to electrically connect its two terminals 123 and 127 together. This operation has essentially no effect on the state of antifuse 121 which stays in whatever state it was in previously.

Lower fuse blow circuit 173 is specific for blowing a single lower antifuse or a plurality thereof connected in parallel with each other, while upper fuse blow circuit 174 is specific for separately blowing a single upper antifuse or a plurality of thereof connected in parallel with each other.

Hence, lower fuse blow circuit 173 and upper fuse blow circuit 174 are independently arranged for selective separate actuation to blow the lower antifuse, such as lower antifuse 121, and the upper antifuse, such as upper antifuse 122, independently of each other.

The lower fuse state sensing and indicating circuit 175 senses whether an antifuse is unblown or blown and provides an output signal at output 177 indicating the state of the lower antifuse 121. The upper fuse state sensing and indicating circuit 176 senses whether an antifuse is unblown or blown and provides an output signal at output 178 indicating the state of the upper antifuse 122.

With ground potential coupled to terminal 123 and switches S1 and S2 not used, the circuitry 170 operates as follows. A high voltage applied to terminal 127 by the upper fuse blow circuit 173 causes the upper antifuse 121 to blow. A high voltage applied to terminal 125 by the lower fuse blow circuit 173 causes the lower antifuse 122 to blow. If high voltages are generated by the upper and lower blow circuits 174 and 173 at the same time, both of the antifuses 121 and 122 can be blown simultaneously.

Figure 16:
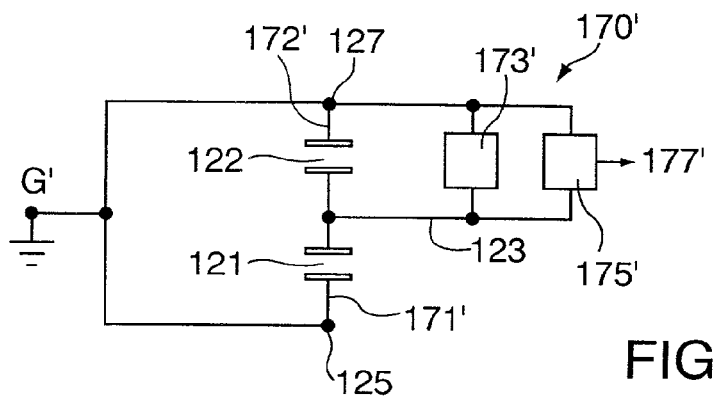
FIG. 16 is a schematic view of an alternative circuit arrangement for simultaneous activation of antifuses according to the invention.

Referring now to FIG. 16, there is shown in block form and schematic form circuitry 170' for simultaneous activation (blowing), per conventional technique, of one (e.g., antifuse 121 of FIGS. 1, 2, and 3) or more (parallel connected) lower antifuses and one (e.g., antifuse 122 of FIGS. 1, 2, and 3) or more (parallel connected) upper antifuses according to the invention, in which all of the pertinent lower and upper antifuses are commonly connected in parallel with each other. Circuitry 170' comprises a lower antifuse circuit 171', an upper antifuse circuit 172', a fuse blow circuit 173' and a fuse state sensing and indicating circuit 175'. Fuse state sensing and indicating circuit 175' has an output 177'.

Terminal 123 is coupled to first terminals of antifuses 121 and 122 and to the fuse blow circuit 173' and the fuse state sensing and indicating circuit 175'. A second terminal 127 of upper antifuse 122 is coupled to a second terminal 125 of the lower antifuse 121, to fuse blow circuit 173', to fuse state sensing and indicating circuit 175', and to a reference potential terminal which is shown as ground potential G.

In operation a high voltage, e.g., +6 volts, is generated by fuse blow circuit 173' on terminal 123. This causes the upper and lower antifuses 122 and 121 to blow simultaneously.

Fuse state sensing and indicating circuit 175' senses and indicates at output 177' the unblown or blown fuse activation state of both the lower antifuse, such as lower antifuse 121, and the upper antifuse, such as upper antifuse 122.

It is noted that in FIG. 15 the lower fuse blow circuit 173 and the lower fuse state sensing and indicating circuit 175 are specific to the characteristics of the given lower antifuse or antifuses, for blowing the lower antifuse or antifuses and for sensing and indicating the unblown or blown state thereof. Likewise, the upper fuse blow circuit 174 and upper fuse state sensing and indicating circuit 176 are specific to the characteristics of the given upper antifuse or antifuses, for blowing the upper antifuse or antifuses and for sensing and indicating the unblown or blown state thereof.

Hence, the characteristics of the lower fuse blow circuit 173 and lower fuse state sensing and indicating circuit 175 will differ from the characteristics of the upper fuse blow circuit 174 and upper fuse state sensing and indicating circuit 176 where the characteristics of the lower antifuse or antifuses differ from those of the upper antifuse or antifuses contemplated.

On the other hand, common fuse blow circuit 173' and common fuse state sensing and indicating circuit 175' are specific to the characteristics of the contemplated lower and upper antifuses, which in this case are more or less the same or equivalent characteristics, for simultaneously blowing all the antifuses at the same time and at the same voltage, and for sensing and indicating the common unblown or blown state thereof.

Lower and upper fuse state sensing and indicating circuits 175 and 176, per FIG. 15, and common fuse state sensing and indicating circuit 175', per FIG. 16, are efficiently used to determine the unblown or blown state of the lower antifuse, such as lower antifuse 121, and/or the upper antifuse, such as upper antifuse 122, by evaluating pertinent physical characteristics, such as capacitance, resistance, etc., in parallel.

For instance, a resistance evaluation measures the total resistance of two parallel connected resistors. Hence, a low resistance across one of the antifuses leads to a low total resistance, indicating that at least one of the antifuses is blown.

A function table, designated Table 1, for resistance evaluation in this regard is set forth below.

TABLE 1

| Lower Antifuse Resistance | Upper Antifuse Resistance | Total Resistance | Interpretation |
|---|---|---|---|
| High | High | High | Unblown |
| High | Low | Low | Blown |
| Low | High | Low | Blown |
| Low | Low | Low | Blown |

Of course, evaluation of other physical characteristics can be treated accordingly. The desired result is conveniently a signal such as signal 177, 178 or 177'. The signal indicates the given unblown or blown state of the lower antifuse and upper antifuse, one state representing a situation where none of the antifuses is blown, and the other state representing a situation in which at least one of the antifuses is blown.

In the case of antifuses connected in parallel with each other, all of the antifuses are considered as blown if at least one of the antifuses is blown. Use of parallel connected antifuses affords increased reliability of the arrangement since it improves the fuse blow yield.

Thus, even though one or more parallel connected antifuses might not blow when the blow voltage is applied thereto, such as might be due to local processing variations, it is clear that by providing more than one antifuse of the same or equivalent type, the probability of blowing at least one of the parallel connected antifuses is increased. Indeed, it is sufficient to blow only one antifuse in the parallel configuration, since a single conducting path resulting therefrom would be sufficient to lower the electrical resistance of the fuse element between the electrodes, thus indicating a blown state.

While fuse activation circuits 170 and 170' of FIGS. 15 and 16, respectively, are shown in terms of blowing antifuses 121 and 122, and of sensing and indicating the unblown or blown state thereof, it is clear that antifuse circuits 171 and 172, as well as 171' and 172', fuse blow circuits 173 and 174, as well as 173', fuse state sensing and indicating circuits 175 and 176, as well as 175', and output signals 177 and 178, as well as 177', as the case may be, are applicable to any and all types of antifuses contemplated herein.

Thus, the lower antifuses and upper antifuses may be activated individually or simultaneously, i.e., with the (parallel connected) lower antifuses being activated independently of the (parallel connected) upper antifuses per fuse activation circuit 170 (FIG. 15), or with all of the (parallel connected) lower and upper antifuses being activated simultaneously per fuse activation circuit 170' (FIG. 16).

For independent blowing of two or more vertically stacked antifuses, the fuse elements of the given antifuses share the common intermediate electrode and have separate connections to the lower counter electrode or upper counter electrode as the case may be (FIG. 15). For conjoint, i.e., simultaneously, blowing of two or more vertically stacked antifuses, the fuse elements of the given antifuses are connected in parallel and thus share both electrode connections, i.e., they share the common intermediate electrode and lower counter electrode in the case of the lower antifuse or antifuses, and the common intermediate electrode and upper counter electrode in the case of the upper antifuse or antifuses (FIG. 16).

Typically, fuse elements 124, 224, 324, 124a, 124b, 126, 226, 326, 126a and 126b, are relatively thin, each being about 5 nm in thickness (height).

Lower electrodes 125, 125a, 125b and 325 are typically each about 150 nm in thickness (height), while lower electrode 225 is about 150 nm in thickness (depth), i.e., in the form of a diffusion region in wafer 201. Similarly, lower electrodes 125, 125a, 125b and 325 are each about 150 nm in width (from left to right as shown in FIGS. 1, 7, 8, and 11), whereas lower electrode 225, i.e., as defined by its diffusion region in top surface 102 in wafer 101, is of somewhat larger width, e.g., 250 to 300 nm in width (from left to right as shown in FIG. 4).

Contact portions 161, 241, 261, 341, 361, 161a and 161b are typically each about 600 nm in thickness (height), and also each about 200 nm in width (from left to right as shown in FIGS. 1, 4, 7, 8, 11 and 13) and 200 nm in length (from the upper side to the underside of the paper of FIGS. 1, 4, 7, 8, 11, and 13 in a direction normal to the plane of the paper, or more clearly from top to bottom as shown in FIGS. 2, 3, 5, 6, 9, 10, 11, and 12), thus forming an electrode cross sectional area of about 40,000 nm$^2$ (200 nm width×200 nm length).

The typical fuse blow (activation) conditions include a blow voltage of about 5V to 10V, such as 8V, and a blow current of about 100 uA to 1 mA, such as about 200 uA.

Of course, the fuse element thickness determines the electric field that is applied across the inherent insulator formed by the fuse element, such that the thinner the fuse element the higher the electric field that can be applied to blow the antifuse under increasingly more optimum conditions.

As noted above, any given antifuse is activated (blown) by applying a blow voltage across the common intermediate electrode and counter electrode, causing an electric current to pass through its fuse element so as to generate an electric field in the fuse element which damages (breaks down or causes a short in) the fuse element irreversibly and creates a, i.e., suitably grounded, electrically conductive path between the common intermediate electrode and the counter electrode.

According to the invention, area efficient vertical stacking of antifuses is attained by use of two courses or levels thereof, one above the other, each containing one or more antifuses, and sharing a common intermediate electrode therebetween. This spatial arrangement avoids the need for a fourth electrode since a common intermediate electrode is used with two counter electrodes. It also reduces, by up to half, the side by side or width dimension of a lateral extent of antifuses, since up to double the number of antifuses are accommodated vertically one above the other in the two courses or levels, for a given width on the semiconductor wafer.

This enables inclusion of a plurality of antifuses in tight pitch array in a side by side arrangement limited only by the size (width) of the given antifuses, for redundancy or custom wiring activation. In particular, this permits achievement of an increase in chip yield (module repair) and a reduction in test costs.

While it is generally unclear initially as to which type of antifuse will sufficiently exhibit the desired parameters to be included in the final product, pertinent selection of similar type antifuses, e.g., gate oxide type antifuses and contact type antifuses, such as arranged in parallel with each other, in the two courses or levels of the vertically stacked arrangement of the invention, will provide an inventory of redundant antifuses.

This inventory will enable individual antifuse selection for inclusion in the final product, without chip size overhead, i.e., without an area penalty, and especially a reduction of up to half of the width otherwise needed to accommodate the same number of antifuses on a single course or level of a given site of a semiconductor wafer.

An advantage of the independent use, i.e., blowing, of each antifuse individually is that it can result in an increase of the ratio of antifuse information bits per lateral chip area. An advantage of the parallel connection of two or more vertically stacked antifuses of different type is that it can result in higher reliability inasmuch as antifuses with fuse elements of different implementation exhibit different processing windows, i.e., present different processing conditions which can be selectively exploited for optimized chip yield, minimized test costs, more versatile custom design, and the like.

Advantage may be taken of the fact that certain different type antifuses, such as gate oxide antifuses and dual damascene or contact antifuses, are compatible in characteristics, including blow voltage properties, such that both may be included in the same vertical stack, e.g., with the gate oxide antifuses situated on a lower course or level and the contact antifuses situated on an upper course or level thereabove, for selective fuse blow activation. In this regard, gate oxide antifuses and contact antifuses, both having similar low blow voltages, can be advantageously served by a common intermediate electrode, e.g, as a shared voltage supply line.

On the other hand, it would normally not be desirable to include BJT type antifuses with either gate oxide antifuses or contact antifuses in the vertical stack because of the relative incompatibility of their characteristics, e.g., blow voltage properties, to each other. In this regard, BJT type antifuses have a high blow voltage compared to the similarly low blow voltage of gate oxide antifuses and contact antifuses.

Additionally, the same type antifuses may be advantageously provided in the same vertical stack, e.g., with contact antifuses situated on both the lower and upper courses or levels, for selective fuse blow activation.

A significant advantage of the invention is that two antifuse types can be evaluated on the same wafer (semiconductor body) without an area penalty.

Another advantage of the invention is that the common intermediate electrode serves as a shared power line for both the lower course antifuses and the upper course antifuses, whether the lower course antifuses are of one type and the upper course antifuses are of a different type, or all such antifuses are of the same type. This shared power line function of the common intermediate electrode conveniently eliminates the need for a fourth electrode, thus reducing fabrication costs.

According to the invention, this shared power line can conveniently serve as a single power line for all antifuses, e.g., with all of the antifuses butted together in a typical fuse bank configuration. Hence, the lower course of side by side antifuses can be arranged to form a lower bank of antifuses and the upper course of side by side antifuses can be arranged to form an upper bank of antifuses (see FIGS. 11 to 12 as to use of different type antifuses correspondingly on the lower and upper courses, and FIGS. 13 and 14 as to use of the same type antifuses on both the lower and upper courses).

Similarly, the close proximity of the lower course of antifuses and the upper course of antifuses in the vertically stacked arrangement of the invention permits the sharing of a common ground line G therewith, e.g., conveniently extending at the same level as the upper electrode yet also relatively close to the lower level electrode (see FIGS. 1, 4, 7, 8, 11, and 13).

Accordingly, it can be appreciated that the specific embodiments described are merely illustrative of the general principles of the invention. Various modifications may be provided consistent with the principles set forth.

What is claimed is:

1. An apparatus, comprising:
   a semiconductor body having on a surface thereof at least one lower antifuse and at least one upper antifuse in vertically stacked relation, the upper and lower antifuse coupled to a common intermediate electrode formed between them;
   the lower antifuse having a source region and a drain region formed on said surface, the drain region and the source region being coupled to said common intermediate electrode, and a lower fuse element of a lower fusible insulator portion of initial high electrical resistance overlying said surface, a gate electrode in contact with the lower fusible insulator portion for interconnecting the gate electrode and the common intermediate electrode;
   the upper antifuse having an upper counter electrode and an upper fusible insulator portion of initial high electrical resistance defining an upper fuse element interconnecting the upper counter electrode with the common intermediate electrode; and
   the upper and lower antifuses being arranged to permit their selective energizing for corresponding separate or simultaneous activation to a final low resistance electrical state, in both directions between said intermediate electrode and said gate electrode and in both directions between said intermediate electrical and said upper counter electrode.

2. The apparatus of claim 1, wherein the upper antifuse is directly connected to the common intermediate electrode.

3. The apparatus of claim 1, and further comprising upper and lower activation circuitry for selectivly energizing the upper and lower antifuses separately or simultaneously.

4. The apparatus of claim 1 wherein the upper antifuse is in the form of a contact antifuse defining a conductive contact interposed between the upper counter electrode and the common intermediate electrode.

5. Apparatus comprising:
   a semiconductor body having on a surface thereof at least one lower antifuse and at least one upper antifuse in vertically stacked relation with both such antifuses sharing a common intermediate electrode there-between;
   the lower antifuse having a lower counter electrode and lower fusible insulator portion defining a lower fuse element of an initial high electrical resistance state interconnecting the lower counter electrode with the common intermediate electrode; and
   the upper antifuse having an upper counter electrode and an upper fusible insulator portion defining an upper fuse element of an initial high electrical resistance state interconnecting the upper counter electrode with the common intermediate electrode;
   the upper and lower antifuses being arranged to permit their respective selective energizing for corresponding separate or simultaneous activation to a final low electrical resistance state;
   wherein the lower antifuse having a source region and a drain region correspondingly closely laterally adjacent the lower fusible insulator portion defining the lower fuse element, a gate electrode in contact with the lower fuse element and forming the lower counter electrode, a source conductive extension portion interposed between the source region and the common intermediate electrode, the source conductive extension portion and source region together defining a source electrode extension portion, and a drain conductive extension portion interposed between the drain region and the common intermediate electrode, the drain conductive extension portion and drain region together defining a drain electrode extension portion, for interconnecting the gate electrode by the lower fuse element with the common intermediate electrode through the source electrode extension portion and through the drain electrode extension portion.

6. The apparatus of claim 5, wherein the upper antifuse is in the form of a contact antifuse defining a conductive contact interposed between the upper counter electrode and the upper fusible insulator portion defining the upper fuse element and interconnecting the upper counter electrode with the upper fuse element, the upper fuse element also being directly interconnected with the common intermediate electrode.

7. Apparatus comprising:
   a semiconductor body having on a surface thereof at least one lower antifuse and at least one upper antifuse in vertically stacked relation with both such antifuses sharing a common intermediate electrode therebetween;
   the lower antifuse having a lower counter electrode and a lower fusible insulator portion defining a lower fuse element of an initial high electrical resistance state interconnecting the lower counter electrode with the common intermediate electrode; and
   the upper antifuse having an upper counter electrode and an upper fusible insulator portion defining an upper fuse element of an initial high electrical resistance state interconnecting the upper counter electrode with the common intermediate electrode, wherein the upper antifuse is in the form of a contact antifuse defining a conductive contact interposed between the upper counter electrode and the upper fusible insulator portion defining the upper fuse element and interconnecting the upper counter electrode with the upper fuse element, the upper fuse element also being directly interconnected with the common intermediate electrode;
   the upper and lower antifuses being arranged to permit their respective selective energizing for corresponding separate or simultaneous activation to a final low electrical resistance state in both directions between said intermediate electrode and said upper counter electrode and in both directions between said intermediate electrode and said lower counter electrode; and
   wherein the lower antifuse having a source region and a drain region correspondingly closely laterally adjacent the lower fusible insulator portion defining the lower fuse element, a gate electrode in contact with the lower fuse element and forming the lower counter electrode, a source conductive extension portion interposed between the source region and the common intermediate electrode, the source conductive extension portion and source region together defining a source electrode extension portion, and a drain conductive extension portion interposed between the drain region and the common intermediate electrode, the drain conductive extension portion and drain region together defining a drain electrode extension portion, for interconnecting the gate electrode by the lower fuse element with the common intermediate electrode through the source electrode extension portion and through the drain electrode extension portion.

8. The apparatus of claim 7 the conductive contact further comprises an electrode extension portion interposed between the upper counter electrode and the upper fusible insulator portion.

9. Apparatus comprising:

a semiconductor body having on a surface thereof at least one lower antifuse and at least one upper antifuse in vertically stacked relation with both such antifuses sharing a common intermediate electrode therebetween;

the lower antifuse having a lower counter electrode and a lower fusible insulator portion defining a lower fuse element of an initial high electrical resistance state interconnecting the lower counter electrode with the common intermediate electrode;

the upper antifuse having an upper counter electrode and an upper fusible insulator portion defining an upper fuse element of an initial high electrical resistance state interconnecting the upper counter electrode with the common intermediate electrode;

the upper and lower antifuses being arranged to permit their respective selective energizing for corresponding separate or simultaneous activation to a final low electrical resistance state in both directions between said intermediate electrode and said upper counter electrode and in both directions between said intermediate electrode and said lower counter electrode;

the upper antifuse is in the form of a contact antifuse defining a conductive contact interposed between the upper counter electrode and the upper fusible insulator portion defining the upper fuse element and interconnecting the upper counter electrode with the upper fuse element, the upper fuse element also being directly interconnected with the common intermediate electrode;

the lower antifuse having a source region and a drain region correspondingly closely laterally adjacent the lower fusible insulator portion defining the lower fuse element, a gate electrode in contact with the lower fuse element and forming the lower counter electrode, a source conductive extension portion interposed between the source region and the common intermediate electrode, the source conductive extension portion and source region together defining a source electrode extension portion, a drain conductive extension portion interposed between the drain region and the common intermediate electrode, the drain conductive extension portion and drain region together defining a drain electrode extension portion, for interconnecting the gate electrode by the lower fuse element with the common intermediate electrode through the source electrode extension portion and through the drain electrode extension portion; and energizable fuse activation circuit means defining a lower fuse activation circuit for applying and controlling a selective blow voltage across the lower counter electrode and common intermediate electrode at the lower fuse element for fusibly blowing the lower antifuse to reduce the electrical resistance there across to interconnect electrically conductively the lower counter electrode and the common intermediate electrode thereat, and further defining an upper fuse activation circuit for applying and controlling a selective blow voltage across the upper counter electrode and common intermediate electrode at the upper fuse element for fusibly blowing the upper antifuse to reduce the electrical resistance there across to interconnect electrically conductively the upper counter electrode and the common intermediate electrode thereat.

10. The apparatus of claim 9 further comprising unblown or blown fuse activation state sensing and indicating circuit means defining a lower fuse state sensing and indicating circuit for sensing and indicating the unblown or blown fuse activation state of the lower antifuse, and further defining an upper fuse state sensing and indicating circuit for sensing and indicating the unblown or blown fuse activation state of the upper antifuse.

11. The apparatus of claim 9 wherein the fuse activation circuit means are arranged for independently applying and controlling a selective blow voltage for fusibly blowing the lower antifuse, and for independently applying and controlling a selective blow voltage for fusibly blowing the upper antifuse, to permit their respective selective energizing for corresponding separate fuse activation.

12. The apparatus of claim 9 wherein the fuse activation circuit means are arranged for simultaneously applying and controlling a selective blow voltage for fusibly blowing both the lower antifuse and upper antifuse, to permit their selective energizing for simultaneous fuse activation.

13. The apparatus of claim 12 wherein the lower antifuse and upper antifuse are connected in parallel in the fuse activation circuit.

14. An apparatus comprising:

a semiconductor body having a surface and overlying the surface in vertical relation;

an upper contact antifuse having an upper counter electrode and an upper fusible insulator portion defining an upper fuse element of initial high electrical resistance;

a common intermediate electrode in direct contact with the upper fusible insulator portion of said upper contact antifuse and opposing said upper counter electrode; and a lower contact antifuse having a lower counter electrode and a lower fusible insulator portion defining a lower fuse element of initial high electrical resistance and interconnecting the lower counter electrode with the common intermediate electrode;

the upper and lower antifuses being arranged to permit their respective energizing for separate or simultaneous activation to a final low electrical state in both directions between said common intermediate electrode and said upper counter electrode and in both directions between said common intermediate electrode and said lower counter electrode; and wherein the lower contact antifuse having a source region and a drain region formed on said surface, the drain region and the source region being coupled to said common intermediate electrode, and a lower fuse element of initial high resistance overlying said surface and said lower counter electrode defining a gate electrode in contact with the lower fuse element for interconnecting the gate electrode and the common intermediate electrode; and
an upper fuse activation circuit coupled for selectivly energizing the upper fusible insulator portion to a final low resistance electrical, state in both directions between said intermediate electrode and said upper counter electrode; and
a lower fuse activation circuit coupled for selectivly energizing the lower fusible insulator portion to a final low resistance electrical state and in both directions between said intermediate electrode and said lower counter electrode.

15. The apparatus of claim 14 and further comprising upper and lower activation circuitry for selectivly energizing the upper and lower antifuses separately or simultaneously.

16. The apparatus of claim 14 wherein the upper antifuse is in the form of a direct contact antifuse defining a conductive contact interposed between the upper counter electrode and the upper fusible insulator portion defining the upper fuse element and interconnecting the upper counter electrode with the upper fuse element.

* * * * *

UNITED STATES PATENT AND TRADEMARK OFFICE
CERTIFICATE OF CORRECTION

PATENT NO. : 7,087,975 B2  Page 1 of 1
APPLICATION NO. : 09/751474
DATED : August 8, 2006
INVENTOR(S) : Lehmann et al.

It is certified that error appears in the above-identified patent and that said Letters Patent is hereby corrected as shown below:

Column 27, line 8; delete "electrical, state" insert --electrical state,--

Signed and Sealed this

Twenty-eighth Day of November, 2006

JON W. DUDAS
*Director of the United States Patent and Trademark Office*